(12) United States Patent
Tasbas et al.

(10) Patent No.: US 10,763,257 B2
(45) Date of Patent: Sep. 1, 2020

(54) S-CONTACT FOR SOI

(71) Applicant: pSemi Corporation, San Diego, CA (US)

(72) Inventors: Befruz Tasbas, San Diego, CA (US); Simon Edward Willard, Irvine, CA (US); Alain Duvallet, San Diego, CA (US); Sinan Goktepeli, San Diego, CA (US)

(73) Assignee: pSemi Corporation, San Diego, CA (US)

( * ) Notice: Subject to any disclaimer, the term of this patent is extended or adjusted under 35 U.S.C. 154(b) by 0 days.

(21) Appl. No.: 16/580,088

(22) Filed: Sep. 24, 2019

(65) Prior Publication Data

US 2020/0091148 A1    Mar. 19, 2020

Related U.S. Application Data

(60) Continuation of application No. 15/488,367, filed on Apr. 14, 2017, now Pat. No. 10,438,950, which is a
(Continued)

(51) Int. Cl.
*H01L 27/092* (2006.01)
*H01L 21/84* (2006.01)
(Continued)

(52) U.S. Cl.
CPC .... *H01L 27/092* (2013.01); *H01L 21/823475* (2013.01); *H01L 21/823481* (2013.01);
(Continued)

(58) Field of Classification Search
CPC ............. H01L 21/81; H01L 27/1203; H01L 29/78603; H01L 29/78639; H01L 27/0251;
(Continued)

(56) References Cited

U.S. PATENT DOCUMENTS 6,121,659 A * 9/2000 Christensen ............ H01L 21/84
257/347
7,414,289 B2    8/2008 Wu et al.
(Continued)

FOREIGN PATENT DOCUMENTS

WO    2017099871    6/2017
WO    2020018471    1/2020

OTHER PUBLICATIONS

Retebo, Metasebia T., Notice of Allowance received from the USPTO dated Jan. 27, 2020 for U.S. Appl. No. 15/600,579, 12 pgs.
(Continued)

*Primary Examiner* — Mouloucoulaye Inoussa
(74) *Attorney, Agent, or Firm* — Jaquez Land Greenaus LLP; Alessandro Steinfl, Esq.

(57) ABSTRACT

Systems, methods, and apparatus for an improved protection from charge injection into layers of a device using resistive structures are described. Such resistive structures, named s-contacts, can be made using simpler fabrication methods and less fabrication steps. In a case of metal-oxide-semi-conductor (MOS) field effect transistors (FETs), s-contacts can be made with direct connection, or resistive connection, to all regions of the transistors, including the source region, the drain region and the gate.

19 Claims, 18 Drawing Sheets

Related U.S. Application Data division of application No. 14/964,412, filed on Dec. 9, 2015, now Pat. No. 9,837,412.

(51) Int. Cl.
  *H01L 27/12* (2006.01)
  *H01L 21/8234* (2006.01)
  *H01L 29/06* (2006.01)
  *H01L 29/45* (2006.01)

(52) U.S. Cl.
  CPC .......... *H01L 21/84* (2013.01); *H01L 27/1203* (2013.01); *H01L 29/0649* (2013.01); *H01L 29/45* (2013.01)

(58) Field of Classification Search
  CPC ............. H01L 23/647; H01L 21/76877; H01L 23/528; H01L 23/5226; H01L 23/66; H01L 27/0629; H01L 29/0649; H01L 2223/6677
  USPC .................. 257/347, 301, 384, 355; 438/149
  See application file for complete search history.

(56) References Cited

U.S. PATENT DOCUMENTS

| | | | |
|---|---|---|---|
| 8,048,753 B2 | 11/2011 | Zhou et al. | |
| 9,472,512 B1* | 10/2016 | Toh | H01L 23/485 |
| 9,837,412 B2 | 12/2017 | Tasbas et al. | |
| 9,847,348 B1 | 12/2017 | Abesingha et al. | |
| 10,276,371 B2 | 4/2019 | Englekirk et al. | |
| 10,438,950 B2 | 10/2019 | Tasbas et al. | |
| 10,546,747 B2 | 1/2020 | Englekirk et al. | |
| 10,672,726 B2 | 6/2020 | Englekirk et al. | |
| 2002/0125921 A1 | 9/2002 | Van Wershoven | |
| 2004/0129977 A1* | 7/2004 | Ohkubo | H01L 21/743 257/347 |
| 2006/0011807 A1 | 1/2006 | Lee et al. | |
| 2009/0283854 A1 | 11/2009 | Levy et al. | |
| 2010/0201440 A1* | 8/2010 | Nowak | H01L 21/743 327/581 |
| 2010/0244934 A1 | 9/2010 | Botula et al. | |
| 2011/0278581 A1 | 11/2011 | Inoue et al. | |
| 2012/0313173 A1 | 12/2012 | Dickey | |
| 2014/0191322 A1 | 7/2014 | Botula et al. | |
| 2015/0206964 A1 | 7/2015 | Cheng et al. | |
| 2016/0141228 A1 | 5/2016 | Leobandung | |
| 2016/0336344 A1 | 11/2016 | Mason et al. | |
| 2017/0170177 A1 | 6/2017 | Tasbas et al. | |
| 2017/0338230 A1 | 11/2017 | Tasbas et al. | |
| 2018/0053784 A1 | 2/2018 | Cai et al. | |
| 2018/0158822 A1 | 6/2018 | Tasbas et al. | |
| 2018/0211972 A1 | 7/2018 | Abesingha et al. | |
| 2018/0337043 A1 | 11/2018 | Englekirk et al. | |
| 2018/0337146 A1 | 11/2018 | Englekirk et al. | |
| 2019/0057868 A1 | 2/2019 | Englekirk et al. | |
| 2020/0176252 A1 | 6/2020 | Englekirk et al. | |

OTHER PUBLICATIONS

Office Action received from the USPTO dated Dec. 19, 2017 for U.S. Appl. No. 15/488,367, 6 pgs.
Office Action received from the USPTO dated Mar. 26, 2018 for U.S. Appl. No. 15/488,367, 21 pgs.
Final Office Action received from the USPTO dated Jan. 18, 2019 for U.S. Appl. No. 15/488,367, 41 pgs.
Notice of Allowance received from the USPTO dated May 22, 2019 for U.S. Appl. No. 15/488,367, 21 pgs.
Office Action received from the USPTO dated Sep. 22, 2016 for U.S. Appl. No. 14/964,412, 7 pgs.
Office Action received from the USPTO dated Dec. 15, 2016 for U.S. Appl. No. 14/964,412, 12 pgs.
Final Office Action received from the USPTO dated Jul. 18, 2017 for U.S. Appl. No. 14/964,412, 16 pgs.
Tasbas, et al., Response filed in the USPTO dated Nov. 7, 2016 for U.S. Appl. No. 14/964,412, 5 pgs.
Tasbas, et al., Response filed in the USPTO dated Apr. 13, 2017 for U.S. Appl. No. 14/964,412, 10 pgs.
Peregrine Semiconductor Corporation, Response and English translation of Response filed in the Taiwansese Patent Office dated Apr. 25, 2017 for appln. No. 105131544, 17 pgs.
Peregrine Semiconductor Corporation, English translation of Request for Exam and Voluntary Amendment filed in the Chinese Patent Office dated Apr. 26, 2017 for appln. No. 201610885245.6, 7 pgs.
Peregrine Semiconductor Corporation, Demand and Amendment filed in the EPO dated Jun. 28, 2017 for appln. No. PCT/US2016/054982, 24 pgs.
Tasbas, et al., Response filed in the USPTO dated Sep. 15, 2017 for U.S. Appl. No. 14/964,412, 12 pgs.
Notice of Allowance received from the USPTO dated Oct. 12, 2017 for U.S. Appl. No. 14/964,412, 12 pgs.
Hoffmann, Niels, Written Opinion received from the EPO dated Nov. 27, 2017 for appln. No. PCT.US2016/054982, 9 pgs.
Botula, et al., "A Thin-film SOI 180nm CMOS RF Switch Technology", IBM Microelectronics, IEEE 2009, 9 pgs.
Sekar, et al., "Comparison of Substrate Effects in Sapphire, Trap-Rich and High Resistivity Silicon Substrates for RF-SOI Applications", IEEE 2015, pp. 37-39.
Kerr, et al., "Identification of RF Harmonic Distortion on Si Substrates and its Reduction using a Trap-Rich Layer", IEEE 2008, pp. 151-154.
Neve, et al., "RF and Linear Performance of Commercial 200 mm trap-rich HR-SOI Wafers for SoC Applications", IEEE 2013, pp. 15-17.
Peregrine Semiconductor Corporation, Response filed in the EPO dated Dec. 29, 2017 for appln. No. PCT/US2016/054982, 17 pgs.
Luu, Chuong A., Office Action received from the USPTO dated Feb. 9, 2018 for U.S. Appl. No. 15/600,588, 15 pgs.
Hoffmann, Niels, International Preliminary Report on Patentability received from the EPO dated Mar. 29, 2018 for appln. No. PCT/US2016/054982, 20 pgs.
Office Action received from the USPTO dated May 29, 2018 for U.S. Appl. No. 15/824,990, 7 pgs.
Le, Dung Anh, Office Action received from the USPTO dated Jun. 22, 2018 for U.S. Appl. No. 15/799,983, 15 pgs.
PSemi Corporation, Response filed in the USPTO dated Aug. 2, 2018 for U.S. Appl. No. 15/799,983, 5 pgs.
Office Action received from the USPTO dated Aug. 30, 2018 for U.S. Appl. No. 15/824,990, 21 pgs.
Le, Dung Anh, Notice of Allowance received from the USPTO dated Sep. 26, 2018 for U.S. Appl. No. 15/799,983, 14 pgs.
Retebo, Metasebia, Office Action received from the USPTO dated Oct. 18, 2018 for U.S. Appl. No. 15/600,579, 6 pgs.
Luu, Chuong A., Notice of Allowance received from the USPTO dated Feb. 21, 2019 for U.S. Appl. No. 15/600,588, 10 pgs.
Retebo, Metasebia T., Office Action received from the USPTO dated Mar. 7, 2019 for U.S. Appl. No. 15/600,579, 45 pgs.
Luu, Chuong A., Office Action received from the USPTO dated Jun. 13, 2019 for U.S. Appl. No. 16/167,424, 12 pgs.
PSemi Corporation, Response filed in the USPTO dated May 3, 2019 for U.S. Appl. No. 15/488,367, 15 pgs.
PSemi Corporation, Response filed in the USPTO dated May 3, 2018 for U.S. Appl. No. 15/488,367, 16 pgs.
PSemi Corporation, Response filed in the USPTO dated Feb. 15, 2018 for U.S. Appl. No. 15/488,367, 7 pgs.
Le, Dung Anh, Office Action received from the USPTO dated Jun. 30, 2017 for U.S. Appl. No. 15/385,618, 9 pgs.
Abesingha, et al., Response filed in the USPTO dated Jul. 31, 2017 for U.S. Appl. No. 15/385,618, 9 pgs.
Le, Dung Anh, Notice of Allowance received from the USPTO dated Sep. 5, 2017 for U.S. Appl. No. 15/385,618, 31 pgs.
Emam, Mostafa, "RF SOI: from Material to ICs—an Innnovative Characterization Approach", FD-SOI and RF-SOI Forum, Friday, Feb. 27, 2015, 35 pgs.

(56) References Cited

OTHER PUBLICATIONS

Roda, et al., "RF and Linear Performance of Commercial 200 mm Trap-Rich HR-SOI Wafers for SoC Applications", SiRF 2013, IEEE 2013, pp. 15-17.
Iperione, Analia, International Search Report and Written Opinion received from the EPO dated Dec. 14, 2016 for appln. No. PCT/US2016/054982, 16 pgs.

* cited by examiner

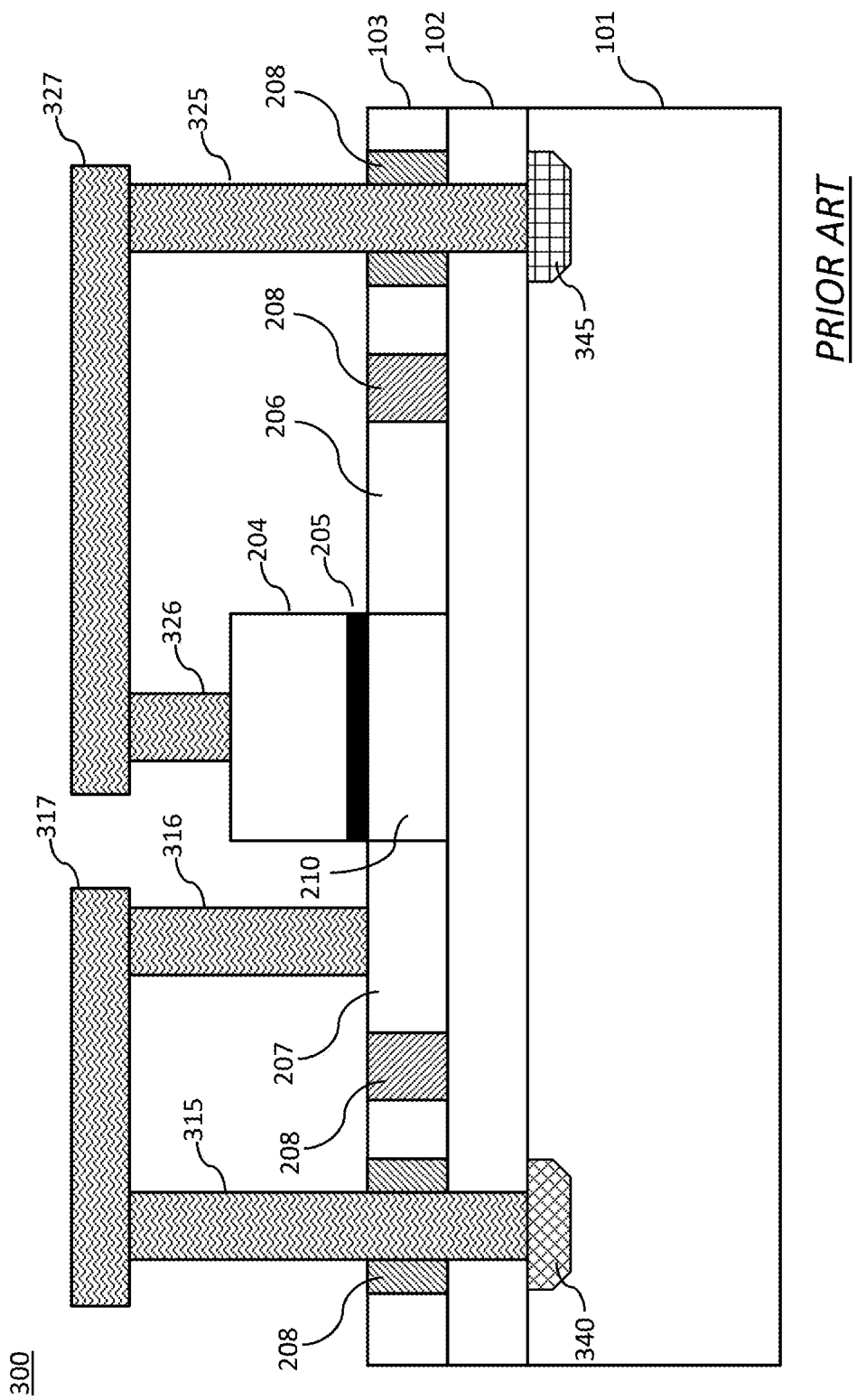
FIG. 3A *PRIOR ART*

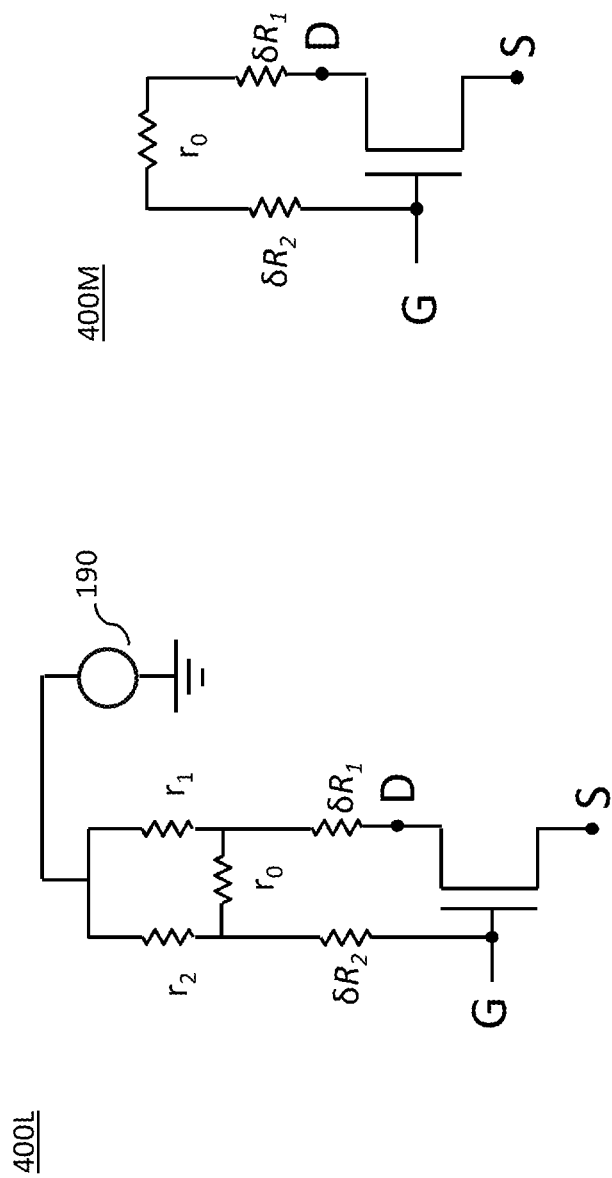

S-CONTACT FOR SOI

CROSS REFERENCE TO RELATED APPLICATIONS

The present application is a continuation of U.S. patent application Ser. No. 15/488,367 filed on Apr. 14, 2017, the disclosure of which is incorporated herein by reference in its entirety. Application Ser. No. 15/488,367 is a divisional of U.S. application Ser. No. 14/964,412 filed on Dec. 9, 2015, now U.S. Pat. No. 9,837,412 issued Dec. 5, 2017, the disclosure of which is incorporated herein by reference in its entirety.

TECHNICAL FIELD

Various embodiments described herein relate generally to systems, methods, and apparatus for protection against charging of a silicon-on-insulator (SOI) device during a manufacturing phase of the device.

BACKGROUND

A fabrication phase of a semiconductor device can include a process that subjects the semiconductor device to a potential gradient, or induces a charge on the surface of the semiconductor device. In some cases, high energy electrically charged particles (ions), associated with such a process can in turn enter layers of the semiconductor device and get trapped inside such layers. Trapped charges inside the layers can in turn adversely affect operating characteristics of the semiconductor device, such as high variation of corresponding threshold voltages, and in extreme cases can cause breakup of internal structures/layers of the device, rendering the device non-functional.

Various methods and apparatus for providing a discharge path for the charges injected inside the various layers of the semiconductor device during, for example, the plasma etching phase, have been devised. Such semiconductor devices can include metal-oxide-semiconductor (MOS) field effect transistors (FETs), and particularly to MOSFETs fabricated on silicon-on-insulator (SOI) and silicon-on-sapphire (SOS) substrates.

In particular, methods and apparatus for providing a discharge path to layers of an SOI device fabricated on a low resistivity substrate use a combination of an active diode and/or a junction diode. Such diodes are used so as to not affect normal operation of the semiconductor device fitted with the discharge path. In cases where a high resistivity substrate is used to fabricate the SOI device, it may be desirable to provide a simpler, more compact, and yet effective discharge path.

SUMMARY

According to a first aspect of the present disclosure, a device is presented, the device comprising: a high resistivity semiconductor substrate; an insulation layer overlying the substrate; an active layer overlying the insulation layer and comprising active regions and isolation regions of the device; a transistor formed in an isolated portion of the active layer, the transistor comprising a drain region, a source region and a gate channel region; and a first conductive structure resistively connecting one of: a) a drain contact or a source contact, and b) a gate contact to the semiconductor substrate, the first conductive structure comprising: a first conductive line connecting the one of a) and b) to a first conductive contact, the first conductive contact extending through the active layer at a region of the active layer outside the isolated portion of the active layer, and through the insulation layer to make contact with the semiconductor substrate.

According to a second aspect of the present disclosure, a device is presented, the device comprising: a high resistivity semiconductor substrate; a trap rich layer overlying the substrate an insulation layer overlying the trap rich layer; an active layer overlying the insulation layer and comprising active regions and isolation regions of the device; a transistor formed in an isolated portion of the active layer, the transistor comprising a drain region, a source region and a gate channel region; and a first conductive structure resistively connecting one of: a) a drain contact or a source contact, and b) a gate contact to the semiconductor substrate, the first conductive structure comprising: a first conductive line connecting the one of a) and b) to a first conductive contact, the first conductive contact extending through the active layer at a region of the active layer outside the isolated portion of the active layer, further extending through the insulation layer and penetrating the trap rich layer to make resistive contact with the semiconductor substrate.

According to third aspect of the present disclosure, a method for providing a discharge path to a silicon-on-insulator (SOI) transistor device is presented, the method comprising: (i) forming an active layer on a high resistivity substrate, the active layer being isolated from the high resistivity substrate via an insulation layer overlying the high resistivity substrate; (ii) forming active regions of the transistor device within an isolated portion of the active layer, the active regions comprising a source region, a drain region and a gate channel region of the transistor device; (iii) forming a first conductive structure resistively connecting at least one of: a) a drain contact and/or a source contact, and b) a gate contact of the transistor device to the high resistivity substrate, the first conducting structure being formed by: forming a first conductive line connecting the at least one of a) and b) to a first conductive contact; extending the first conductive contact through the active layer at a region of the active layer outside the isolated portion of the active layer, and through the insulation layer to make a resistive contact with the high resistivity semiconductor substrate, and (iv) based on the forming of the first conductive structure, providing a first discharge path to the transistor device.

BRIEF DESCRIPTION OF THE DRAWINGS

The accompanying drawings, which are incorporated into and constitute a part of this specification, illustrate one or more embodiments of the present disclosure and, together with the description of example embodiments, serve to explain the principles and implementations of the disclosure.

FIG. 3A shows a prior art embodiment for providing discharge paths to an active layer and a gate polysilicon layer of an SOI transistor device.

FIG. 4L shows a schematic representation of the device of FIG. 4B when the device is inside a process chamber.

FIG. 4M shows a schematic representation of the device of FIG. 4B during normal operation of the device.

DETAILED DESCRIPTION

Figure 1:
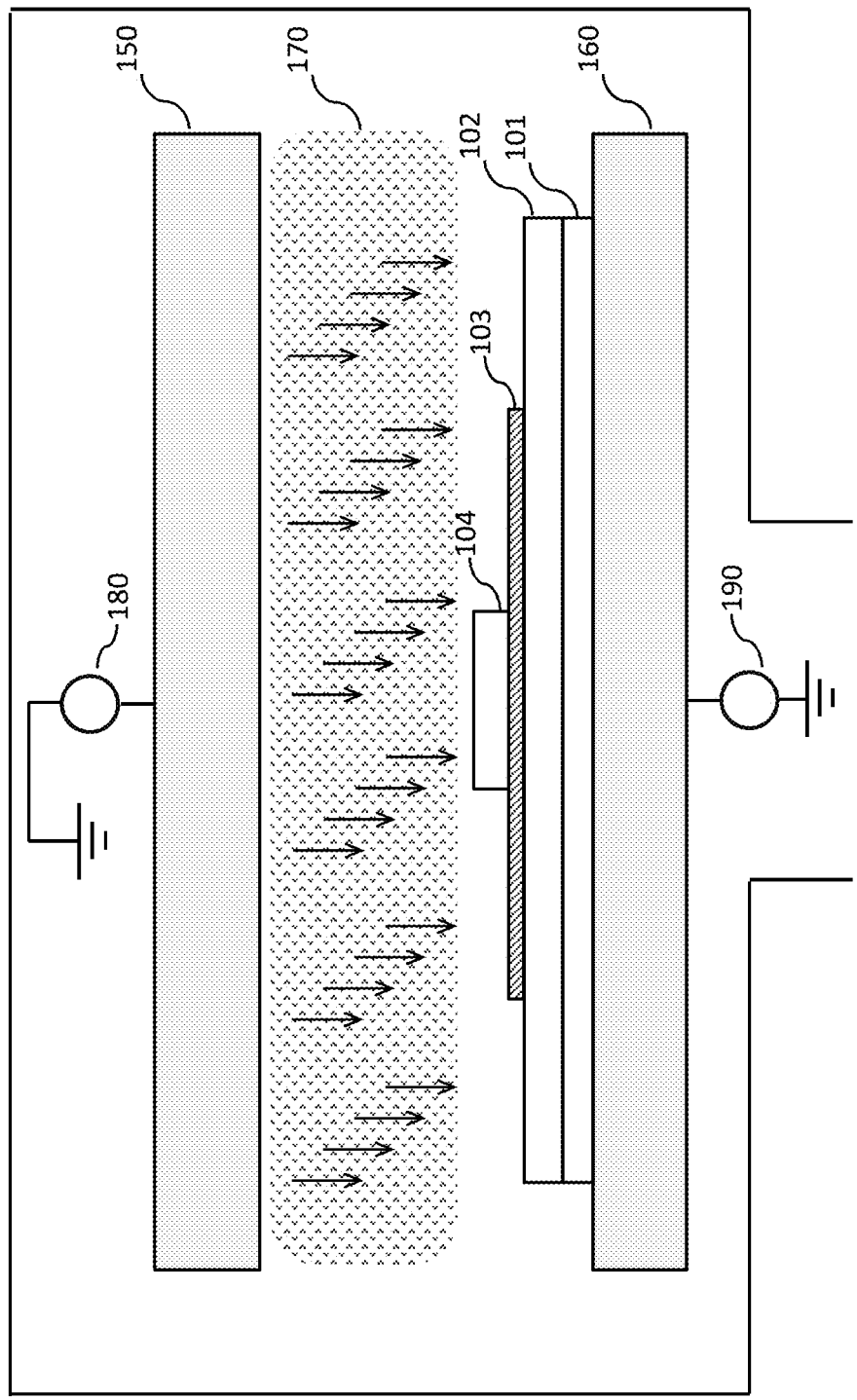
FIG. 1 shows a semiconductor substrate placed inside a plasma etching chamber.

Throughout this description, embodiments and variations are described for the purpose of illustrating uses and implementations of the inventive concept. The illustrative description should be understood as presenting examples of the inventive concept, rather than as limiting the scope of the concept as disclosed herein.

Apparatus and methods that provide a discharge path from layers of a semiconductor device fabricated atop an insulation (electrically insulating) layer are described in the present disclosure. The discharge paths according to the various embodiments of the present disclosure are purely resistive paths and are therefore simpler in construction and comprise fewer fabrication steps when compared to prior art embodiments. Such purely resistive discharge paths can be provided to semiconductor devices which comprise an active layer isolated from an underlying high resistivity substrate via an insulation layer. An exemplary such semiconductor device is an SOI MOSFET transistor (e.g. 400A of FIG. 4A later described) which comprises an insulation buried oxide layer (BOX) (102) between the active layer (103) of the transistor and the high resistivity substrate (401), where the active layer (103) comprises drain (206) and source (207) regions of the transistor surrounding a gate channel (210) of the transistor. In some embodiments the gate channel (210) is defined by a corresponding gate polysilicon structure (204), which is part of a gate poly silicon layer.

As used herein, the expression "active layer" is used to indicate the layer (e.g. 103) which overlies the buried oxide layer (BOX) (e.g. 102) and which is obtained via various CMOS processing steps starting from an original silicon layer. The active layer can include active regions (e.g. 206, 207, 210, 219) of active devices, as well as isolation regions (e.g. 208). In some embodiments, the isolation regions can be used to isolate neighboring active regions of the active layer. In some embodiments the active layer can include passive components, such as resistors, created within regions of the active layer. In general, regions of the active layer where current flows can be referred to as active regions of the active layer.

As used herein, the expression "gate polysilicon layer" is used to indicate a layer (e.g. 104 of FIG. 1) in which gate polysilicon structures (e.g. 204 of FIG. 2B) defining gate channels (e.g. 210 of FIG. 2B) of different semiconductor devices are formed. The gate polysilicon layer can include contiguous and non-contiguous gate polysilicon structures associated with the different semiconductor devices.

The s-contacts according to the present disclosure can provide resistive discharge paths to the active layer and to the gate polysilicon layer by resistively connecting regions of such layers, such as active regions of the active layer and gate polysilicon structures of the gate polysilicon layer, to the high resistivity semiconductor substrate upon which the layers are fabricated.

Figure 4A:
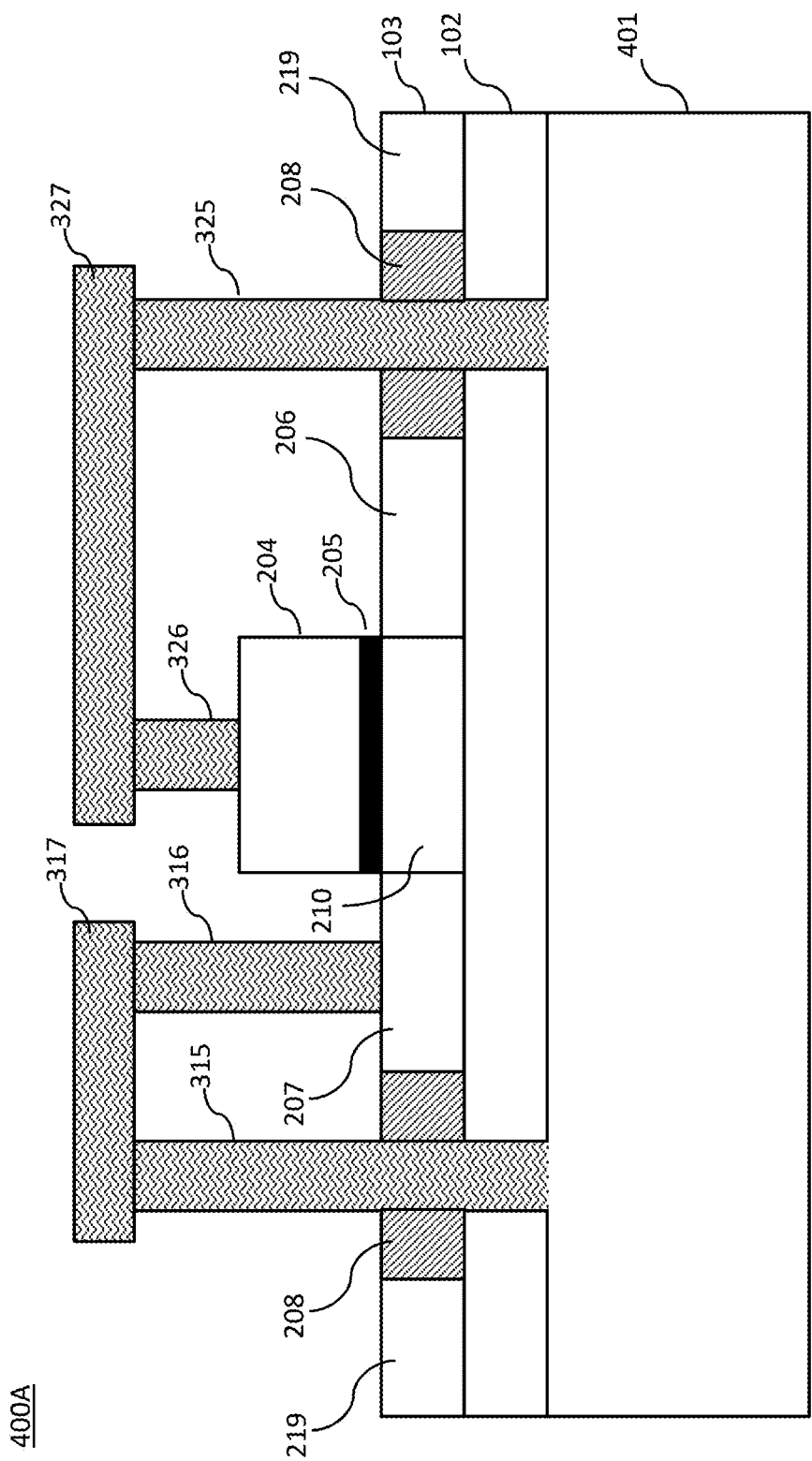
FIG. 4A shows two s-contacts according to an embodiment of the present disclosure provided to an SOI transistor device. The s-contacts provide discharge paths to an active layer (source region) and a gate polysilicon layer of the SOI transistor device.
Figure 4B:
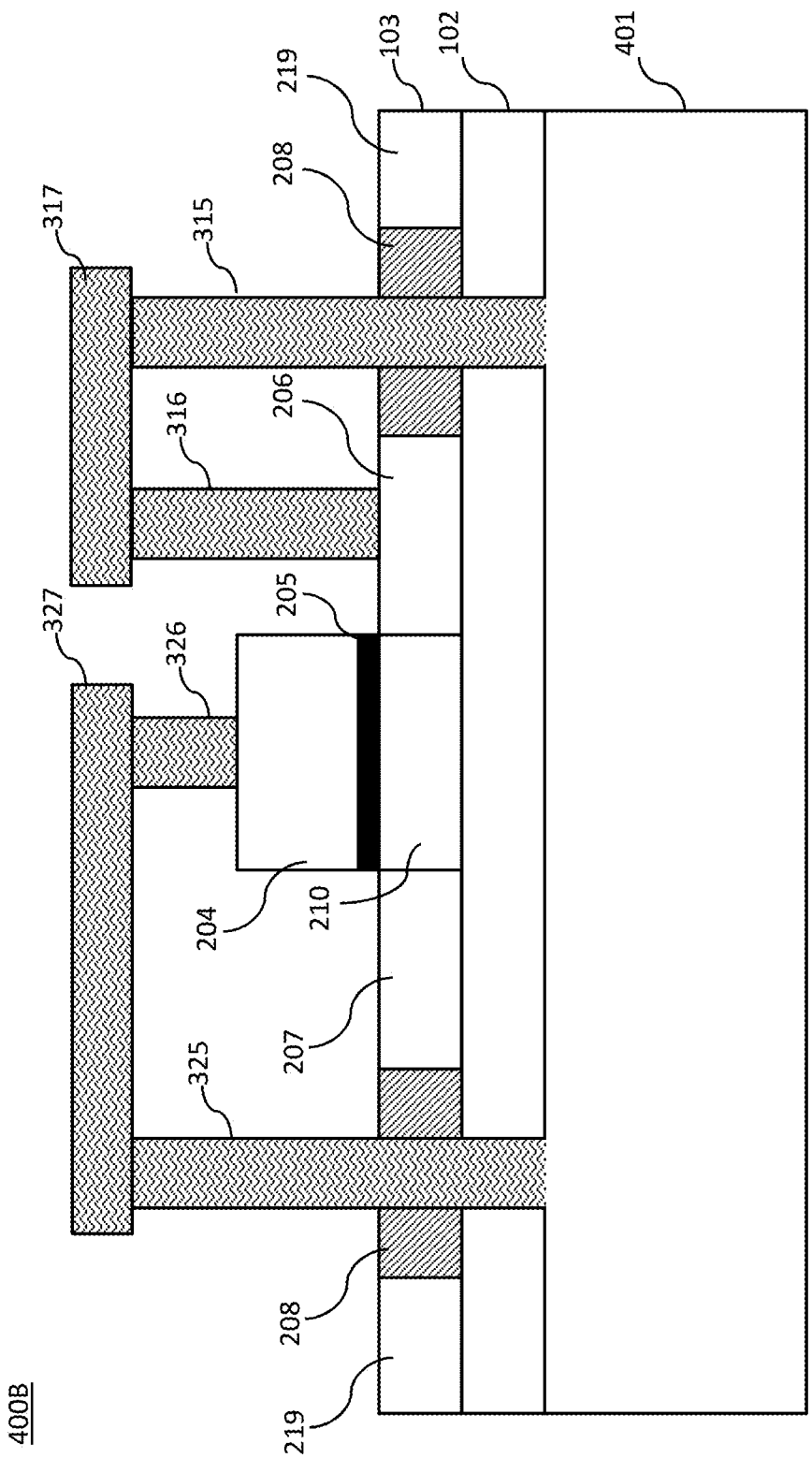
FIG. 4B shows two s-contacts according to an embodiment of the present disclosure provided to an SOI transistor device. The s-contacts provide discharge paths to an active layer (drain region) and a gate polysilicon layer of the SOI transistor device.

As used herein, an s-contact in a semiconductor device, as per the various embodiments of the present disclosure, is a resistive path (e.g. combination of (315, 316, 317) or (325, 326, 327) of FIGS. 4A-4B) which provides a resistive conduction path between a contact point at a surface of a layer (e.g. regions 206, 207 of layer 103 or region 204 of layer 104 as depicted in FIGS. 4A-4B) of the semiconductor device and a contact point at a surface of a high resistivity substrate (e.g. 401 of FIGS. 4A-4B) of the semiconductor device. A person skilled in the art will know of many fabrication methods to provide an s-contact according to the present disclosure.

According to the various embodiments of the present disclosure, material used for the s-contact can be any low resistivity conductive material, such as polysilicon and various metals (e.g. tungsten, copper, etc.). The s-contact according to the present disclosure can be of a same material or comprising several materials providing a piece-wise construction of the s-contact (e.g. (315, 316, 317) or (325, 326, 327) of FIGS. 4A-4B).

According to an embodiment of the present disclosure, the s-contact penetrates through an isolation region (e.g. 208 of FIG. 4A) of the active layer (e.g. 103 of FIG. 4A) of the semiconductor device, and penetrates through the insulation layer (e.g. BOX layer 102 of FIG. 4A) of the semiconductor device to reach, and make contact with, the high resistivity substrate (e.g. 401 of FIG. 4A). In a case of an SOI device, the isolation region (208) can be a shallow trench isolation (STI) region. It should be noted that by virtue of penetrating through the isolation region (208) of the active layer (103), the s-contact remains isolated from the active regions (e.g. 206, 207, 210 of FIG. 4A) of the semiconductor device at all points except for the contact points located at the surface of a layer (e.g. layer 103 or layer 104).

According to a further embodiment of the present disclosure, the s-contact penetrates through the active layer (e.g. 103 of FIG. 4A-4I) of the semiconductor device at an active region (e.g. 219 of FIGS. 4A-4I) of the active layer which can be isolated from other active regions (e.g. 206, 207, 210 of FIGS. 4A-4I) of the device, and penetrates through the insulation layer (e.g. BOX layer 102 of FIGS. 4A-4I) of the semiconductor device to reach, and make contact with, the high resistivity substrate (e.g. 401 of FIGS. 4A-4I). Isolation of the active regions (206, 207, 210) inside the active layer (103) can be provided via isolation regions (e.g. 208 of FIGS. 4A-4I, which can be STI regions).

According to a further embodiment of the present disclosure a plurality of s-contacts (e.g. (315, 316, 317) and (325, 326, 327) of FIGS. 4A-4B) can be provided for a same semiconductor device. Such plurality of s-contacts can be provided to active regions of the semiconductor device formed in the active layer (103), including a drain region (206) and/or a source region (207) of the device, and to the gate polysilicon structure (204) of the device formed in the gate polysilicon layer (104).

According to a further embodiment of the present disclosure, a plurality of devices are formed on a high resistivity substrate (401), and a plurality of s-contacts are provided to active regions of the active layer and to gate polysilicon structures of the gate polysilicon layer associated with the plurality of devices.

According to a further embodiment of the present disclosure, an s-contact making a direct connection to a first device can also provide a discharge path to other devices which are resistively coupled to the first device. The first and the other devices can be, for example, part of a circuit, and interconnections of such a circuit can provide resistive coupling between one or more active regions/gate polysilicon structures of the other devices and an active region/gate polysilicon structure of the first device which is directly connected to an s-contact, thereby effectively providing a resistive discharge path to the one or more active regions/gate polysilicon structures of the other devices. Accordingly, a circuit comprising a plurality of devices (e.g. transistors) can be protected by a shared number of s-contacts, where the sharing is provided via resistive interconnections of the plurality of devices. This can effectively protect all the active regions and all the gate polysilicon structures of the plurality of the devices. In other words, any active region and gate polysilicon structure of a transistor device of the circuit has either a direct connection to an s-contact, or is resistively coupled to an s-contact via circuit interconnections. With reference to FIG. 4A, the conductive contact (316) of the s-contact (315, 316, 317) makes a direct connection to the active region (207) of the device (400A). In other words, the active region (207) of device 400A has a direct connection to the s-contact (315, 316, 317), and the s-contact is said to be associated with the device (400A).

According to a further embodiment of the present disclosure the s-contact makes contact to a region (e.g. 204, 206, 207) of the semiconductor device via a first conductive contact (e.g. 316 and 326 of FIG. 4A), and makes contact to the high resistivity substrate (401) via a second conductive contact (e.g. 315 and 325 of FIG. 4A), where the first and the second conductive contacts are conductively joined via a conductive line (e.g. 317 and 327 of FIG. 4A). According to an embodiment of the present disclosure the conductive line is part of a metal layer of the semiconductor device.

According to a further embodiment of the present disclosure, a trap rich layer (e.g. 402 of FIG. 4I) can be provided between the high-resistivity substrate (401) and the BOX layer (102). A person skilled in the art readily understands some of the benefits provided by including a trap rich layer in an SOI device, description of which is outside the scope of the present disclosure. In a case where a trap rich layer is provided, the s-contact (e.g. 325, 326, 327 of FIG. 4I) can further penetrate through the trap rich layer (402) to make (direct) contact with the high resistivity substrate (401), or, the s-contact (e.g. 315, 316, 317) can penetrate the trap rich layer (402) deep enough to make a resistive contact, through a remaining portion of the trap rich layer's thickness, with the high resistivity substrate (401).

As used herein, a high resistivity substrate is a substrate with a resistivity in a range of 3,000 to 20,000 or higher ohm-cm. The resistivity of the substrate can be controlled via the doping of the substrate, where a lighter doping provides a higher resistivity of the substrate. As known to a person skilled in the art, standard SOI process uses substrates with a low resistivity, below 1,000 ohm-cm. Given the small cross section (e.g. 0.35 µm×0.35 µm) of the conductive contact (315, 325) making contact to the high resistivity substrate (401), the effective contact resistance between the conductive contact (315, 325) and the high resistivity substrate (401) is in the range of 0.2 to 20 G-ohm due to distributed resistance as current crowds to the small contact, and to the non-ohmic nature of the interface due to the light doping of the substrate (401).

As presented in the following sections of the present disclosure, an s-contact according to the various embodiments of the present disclosure can be provided by connecting two conductive contacts via a conductive line, where a first conductive contact is connected to an active layer or a gate polysilicon layer of a semiconductor device and a second conductive contact is connected to a high resistivity substrate of the semiconductor device by penetrating through an insulation layer, and optionally through a trap rich layer, of the semiconductor device. Furthermore, the s-contact can in turn be resistively coupled to an active layer or a gate polysilicon layer of a different semiconductor device via resistive interconnections of a common circuit. As discussed above, connection to the active layer and to the gate polysilicon layer can be made via conductive contacts connected to active regions of the active layer and to the gate polysilicon structure of the gate polysilicon layer respectively.

The embodiments as described herein are exemplified by an N-type MOSFET device. A person of ordinary skill in the art will readily apply the inventive concepts as disclosed herein to other types of semiconductor devices, such as a P-type MOSFET device, by applying different types of doping schemes as appropriate. The embodiments according to the present invention can also be applied to extended drain devices, such as laterally diffused metal oxide semiconductor (LDMOS) devices, and other gated transistors or devices which comprise an insulation layer between an active layer and a high resistivity substrate.

Semiconductor devices with s-contacts according to the various embodiments of the present disclosure may include semiconductor devices formed on silicon-on-insulators (SOI), including field effect transistors (FET). The FET devices may include complementary metal-oxide-semiconductor (CMOS), metal-oxide-semiconductor field-effect transistor (MOSFET), and other type field-effect transistor (FET) devices.

In one exemplary embodiment according to the present disclosure, an s-contact can comprise a conductive contact in a square or rectangular shape. As will be described in later sections of the present disclosure, the s-contact can provide a low resistivity conduction path between a region of a top layer of the semiconductor device to the high-resistivity substrate, and therefore provide a discharge path for injected charges during a manufacturing process.

For an exemplary embodiment of an SOI MOSFET transistor according to the present disclosure, one or more s-contacts can be provided to a source and/or drain region of the transistor. Alternatively, or additionally, one or more s-contacts can be provided to the gate polysilicon structure of the transistor.

For an exemplary embodiment of a circuit comprising a plurality of interconnected SOI MOSFET transistors with corresponding active regions and gate polysilicon structures, one or more s-contacts can be provided to the active regions of some or all of the transistors of the circuit, and one or more s-contacts can be provided to the gate polysilicon structures of some or all of the transistors of the circuit. In one exemplary embodiment, circuit interconnections can provide a resistive coupling from an active region and/or gate polysilicon structure of a first transistor to an s-contact of a second transistor, and therefore provide a discharge path to the first transistor.

According to a further embodiment of the present disclosure, number of s-contacts and corresponding spatial placements in a semiconductor device can be provided such as to limit a potential across any two points of the semiconductor device during a charge injection process (e.g. plasma etching). Given a known high resistivity value of the substrate and induced currents through the s-contacts during the charge injection process, the number of s-contacts to limit such potential difference can be derived. This can be performed with the help of simulation software. The person skilled in the art will understand that due to the purely resistive nature of the s-contacts according to the present invention, a trade off exists between a leakage during operation of the semiconductor device associated with the addition of the s-contacts, and the amount of protection the s-contacts provide during manufacturing of the device.

FIG. 1 shows a semiconductor substrate (101) placed inside an exemplary high energy manufacturing process chamber (100). The semiconductor substrate (101) comprises an active silicon layer (103) comprising active regions of active components with corresponding conductive contacts, and a (gate) polysilicon layer (104) comprising gate polysilicon structures with corresponding conductive contacts atop the polysilicon layer (104). The active layer (103) overlies an insulation layer (102) which prevents conduction between the active layer (103) and the substrate (101). The substrate (101) is placed on a bottom electrode (160) of the chamber which is connected to a bottom potential (190). A top electrode (150) of the chamber is connected to a variable supply (180). Within the exemplary process chamber (100), the semiconductor substrate (101) can be subjected to an event which can create a potential gradient or induce charge on the semiconductor substrate (101), thus resulting in injected charges remaining trapped within the layers (103), (104), or at interfaces between such layers, and can create large potential differences between such layers and the substrate (101) during a processing phase of the substrate. Trapped charges inside the layers can adversely affect operating characteristics (for example change in threshold voltage, change leakage characteristics, etc.) of the active components, while the large potential differences between the layers and the substrate can potentially damage the active components of the active layer rendering them non-functional. By providing a discharge path via contacts at the surface of semi-conductive layers (103) and (104) to the bottom potential (190) coupled to the bottom electrode (160), injected charges into such semi-conductive layers can be prevented (e.g. removed).

Figure 2A:
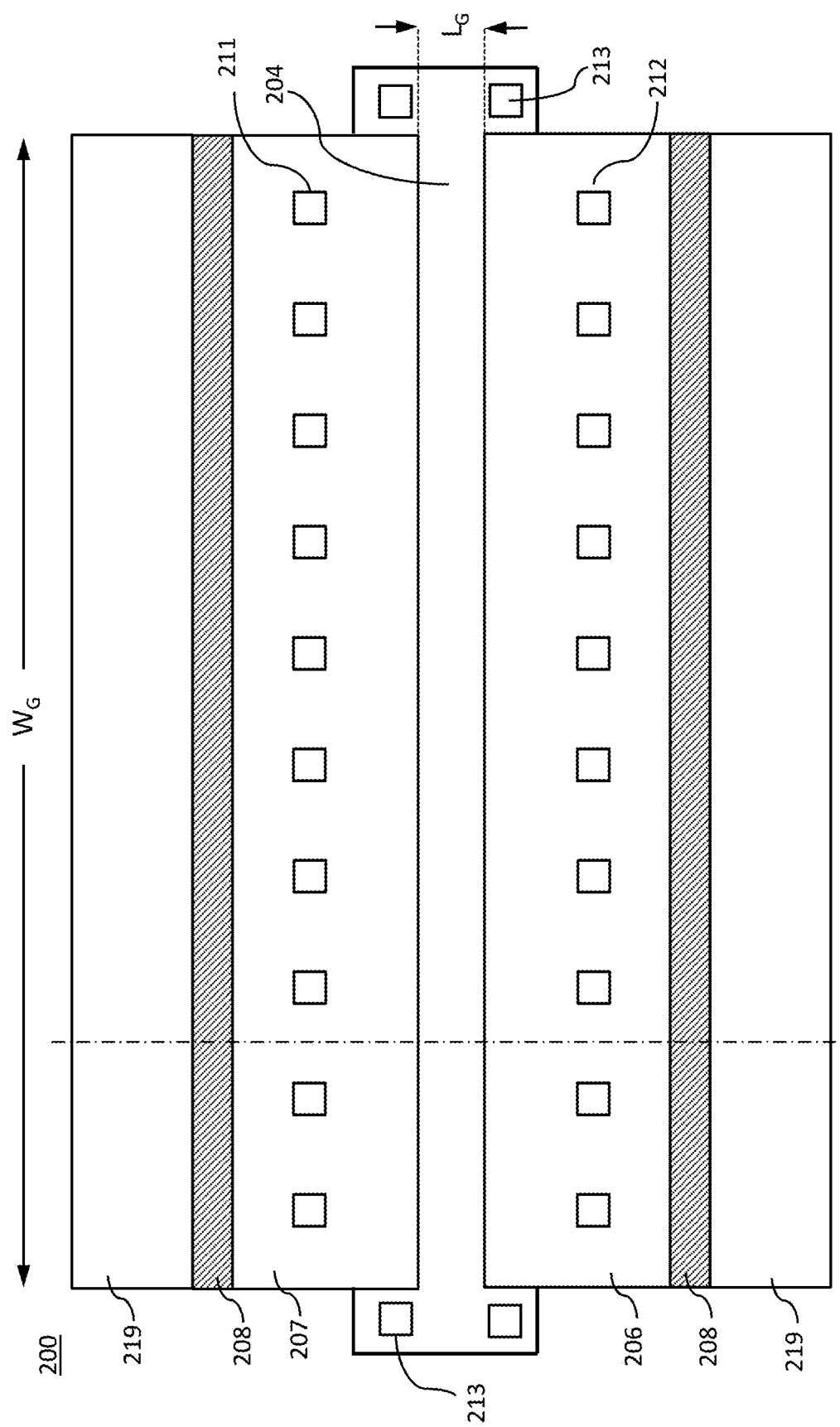
FIG. 2A shows a top view of a silicon-on-insulator (SOI) transistor device.

FIG. 2A shows a top view of an N-type SOI MOSFET device (200) which can be part of the active components formed in an active layer overlying the semiconductor substrate (101). A gate finger (204) of the device (200) is shown to be located between a source region (207) and a drain region (206). The gate finger (204) has a length of $L_G$ and a width of $W_G$. In one aspect, the gate finger can be made via a gate polysilicon structure (204), formed within the polysilicon layer (104), which can block implantation of dopant ions used to dope the neighboring source and drain regions of the MOSFET. A person of ordinary skill in the art readily knows that a multi-finger SOI device can have a plurality of such fingers electrically coupled, where each finger can comprise a corresponding gate polysilicon structure (204) with corresponding gate contacts (213), a drain region (206) with corresponding drain contacts (212) and a source region (207) with corresponding source contacts (211). In some embodiments, neighboring fingers can share a corresponding drain and/or source region. Alternatively, a plurality of fingers corresponding to a plurality of transistor devices can share a same common semiconductor substrate (101) and be electrically isolated with respect to one another. Isolation of the active regions (206, 207) of the device (200) with respect to other active regions (219) formed on the semiconductor substrate (101) can be provided via isolation regions (208). The person of ordinary skills will know that regions outside the labelled regions of FIG. 2A can comprise active regions (219) or isolation regions (208).

Figure 2B:
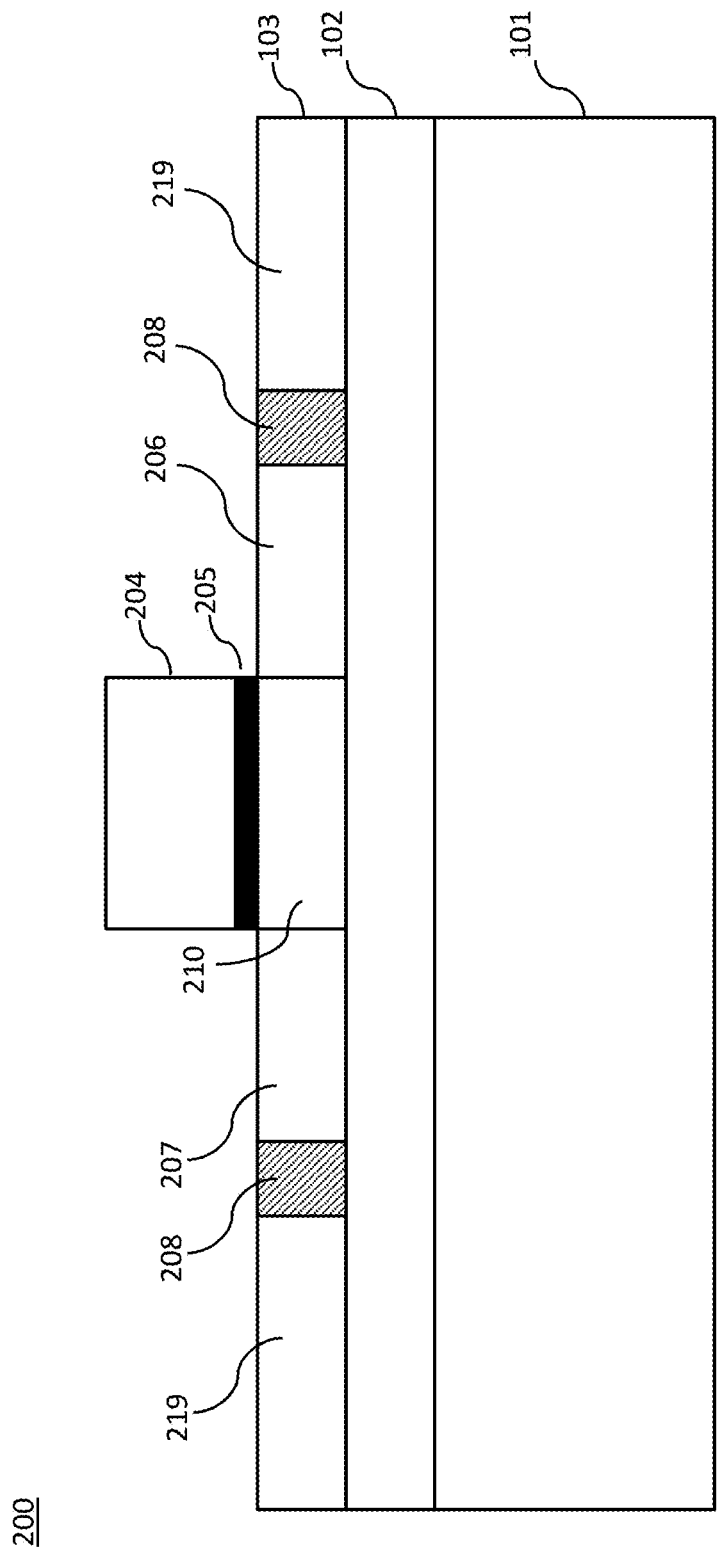
FIG. 2B shows a cross-sectional view of the silicon-on-insulator (SOI) transistor device of FIG. 2A along line AA of FIG. 2A. The SOI transistor device is shown comprising active regions formed in an active layer and a gate polysilicon structure of a gate polysilicon layer fabricated atop an insulation layer.

FIG. 2B shows a cross sectional view of the N-type SOI MOSFET device (200) along line AA of FIG. 2A. As shown in the cross sectional view of FIG. 2B, the SOI MOSFET comprises a layered structure, formed atop the substrate (101), comprising layers (102), (103), (204) and (205). In one aspect, the layer (204), which forms the gate polysilicon structure of the device, is shown to be laid over an insulating gate silicon oxide layer (205). In one aspect, the body region (210) under the layer (204) is doped with a P-type dopant (P-body), and the source (207) and drain (206) regions are heavily implanted with an N-type dopant (N+). As shown in the figures, regions (206), (207) and (210) are part of an active layer (103) which is laid over an insulting buried oxide (BOX) layer (103). Furthermore, as shown in FIGS. 2A and 2B, the device (200) is shown to be isolated from adjacent regions within the active layer (103) (which may contain neighboring circuits comprising other fingers/transistors, not shown) by way of shallow trench isolation (STI) regions (208) which are of non-conductive types. Due to the insulating nature of the BOX layer (102), a conduction path between layers (103), (204) and (205) and the semiconductor substrate (101) is not provided in the SOI MOSFET depicted in FIGS. 2A and 2B, and therefore device (200) is susceptible to charge injection during a high potential manufacturing process.

FIG. 3A shows a prior art embodiment of an SOI MOSFET device (300) which provides a first discharge path between a contact (326) on the gate polysilicon structure (204) and the semiconductor substrate (101), and a second discharge path between a contact (316) on the source region (207) of the device (300) and the semiconductor substrate (101). The person skilled in the art will realize that FIG. 3A does not show an exact cross section of an SOI MOSFET as contact (326) to the gate polysilicon structure (204) is typically in a different cross sectional plane from the cross section plane of contact (316) to the source region (207).

As can be seen in the prior art embodiment depicted in FIG. 3A, the first discharge path comprising the conductive contact (326), conductive line (327), conductive contact (325), N-type doped region (345), and the semiconductor substrate (101). Conductive contacts (325, 326) and conductive line (327) can be made of metal, such as copper or tungsten. Furthermore, the N-type doped region (345), buried within the semiconductor substrate (101), and the P-type doped region of the substrate (101), making contact to the region (345), create a junction diode. Therefore, the first discharge path couples the gate polysilicon layer (204) to the semiconductor substrate (101) via a junction diode.

The second discharge path of the prior art device (300) depicted in FIG. 3A comprises the conductive contact (316), conductive line (317), conductive contact (315), P-type doped region (340), and the semiconductor substrate (101). Similar to the first discharge path, conductive contacts (315, 316) and conductive line (317) can be made of metal, such as copper or tungsten.

It should be noted that both the first and the second discharge paths of the prior art device (300) couple the conductive contacts (315) and (325) to the semiconductor substrate (101) via regions (340) and (345) respectively. Therefore direct contact between such contacts and the semiconductor substrate (101) is not present in the prior art embodiment depicted in FIG. 3A.

When the prior art device (300) is placed in the process chamber (100), the junction diode formed by elements (345) and (101) of the first discharge path allows for a flow of charge (e.g. electrons) from the gate polysilicon structure (204) of the polysilicon layer (104) to the bottom electrode plate to which the semiconductor substrate (101) is coupled. Similarly, the second discharge path allows for a flow of charge from the source region (207) of the active layer (103) to the bottom electrode plate to which the semiconductor substrate (101) is coupled. The person skilled in the art will realize that the junction diode can be leaky for the currents generated inside of the process chamber, and therefore charges can flow in either direction.

In the prior art device (300) depicted in FIG. 3A, the semiconductor substrate (101) has a low resistivity, and can therefore provide a low resistance conduction path between any two regions inside the substrate (101), including regions (340) and (345). Therefore, the junction diode formed by regions (345, (101) of the prior art device (300) is required such as not to allow a conduction path between the gate contact (326) and the source contact (316) during normal operation of the device (e.g. via a low resistivity path provided by the semiconductor substrate (101) between conductive contacts (315) and (325)).

Figure 3C:
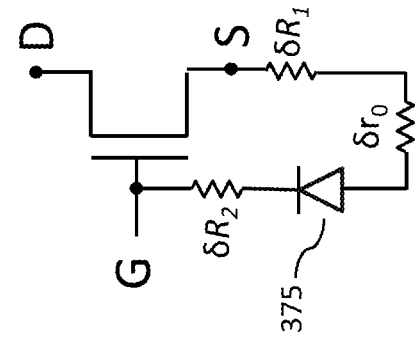
FIG. 3C shows a schematic representation of the prior art device of FIG. 3A during normal operation of the device.
Figure 3B:
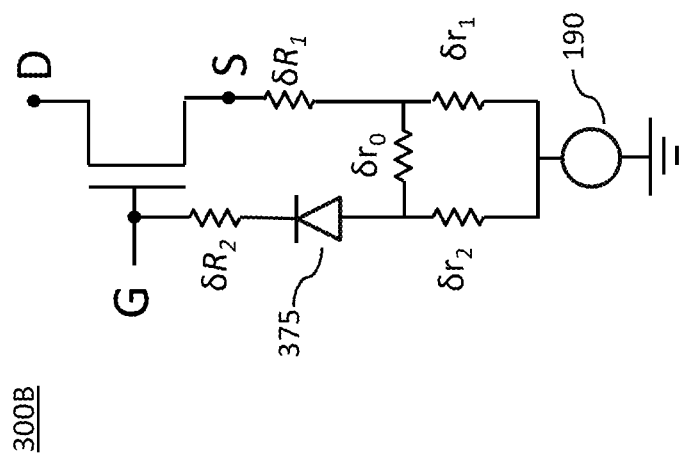
FIG. 3B shows a schematic representation of the prior art device of FIG. 3A when the device is inside a process chamber.

FIGS. 3B and 3C schematically represent the prior art device (300) in the configuration (300B), where the device is inside the process chamber (100), and in the configuration (300C), where the device is during normal operation. These figures show the transistor device (300) and the corresponding conduction paths for each of the two configurations (300B) and (300C). Resistor $\delta R_2$ represents the combined (low) resistance of (325, 326, 327), resistor $\delta R_1$ represents the combined (low) resistance of (315, 316, 317), item (375) represents the junction diode formed by (345) and adjacent regions of (101), $\delta r_0$ represents a resistance of a low resistivity path between region (340) and region (345) of the device (300), and ($\delta r_1$, $\delta r_2$) represent resistances of low resistivity paths between each of the regions (340, 345) and the bottom electrode of the process chamber (which is provided a low reference potential, such as ground). The person skilled in the art will understand that resistances ($\delta r_0$, $\delta r_1$, $\delta r_2$) are provided by the low resistivity semiconductor substrate (101).

With further reference to FIG. 3C, as described above, due to the low resistivity nature of the substrate (101) of the prior art embodiment device (300), the diode (375) is required so as to not provide a current loading of the gate by the source. The person skilled in the art will notice that the required diode (375) blocks a current flow between the gate (G) and the source (S) of the device only during operation of the transistor device (300) where the gate voltage $V_G$ is higher than the source voltage $V_S$, which thereby puts the diode (375) in a reverse bias condition. The prior art embodiment therefore assumes that during normal operation of the device (300), the gate voltage is not lower than the source voltage, as such a condition puts the diode (375) in a forward bias condition, and prevents a desired negative biasing ($V_G < V_S$) of the device.

FIG. 4A shows an exemplary embodiment according to the present disclosure of an SOI MOSFET device (400A) provided with s-contacts. A first s-contact (326, 327, 325) provides a first discharge path between a contact (326) on the gate polysilicon structure (204) formed in the polysilicon layer (104) and the semiconductor substrate (401), and a second s-contact (316, 317, 315) provides a second discharge path between a contact (316) on the source region (207) formed in the active region (103) of the device (400A) and the semiconductor substrate (401). By using a high resistivity semiconductor substrate (401), the s-contacts, and therefore the first and the second discharge paths of the device (400A) according to the present invention, can be made devoid of an active device (e.g. the diode (375) described in relation to the prior art embodiment depicted in FIGS. 3A-3C described above) and can remain purely resistive. As a consequence, efficacy of protection during a high energy process can be maintained with simpler structures and fewer fabrication steps of the device according to the present invention.

As can be seen in the embodiment according to present disclosure depicted in FIG. 4A, the first discharge path (s-contact) comprises a conductive contact (326) making contact with the gate polysilicon structure (204), a conductive line (327), and a conductive contact (325) which makes direct contact with the semiconductor substrate (401) (contrary to the prior art embodiment depicted in FIG. 3A, where contact is indirect and through a coupling region (345) which creates a junction diode). Similarly, the second discharge path (s-contact) comprises a conductive contact (316) which makes contact with the source region (207), a conductive line (317), and a conductive contact (315) which makes direct contact with the semiconductor substrate (401). In an exemplary embodiment of the present disclosure, conductive contacts (315, 316, 325, 326) and conductive lines (317, 327) can be made of metal, such as copper or tungsten. In alternative embodiments according to the present disclosure, such contacts can be made of any low resistivity conductive material, including other metals and polysilicon.

According to further embodiments of the present disclosure, the s-contacts can be resistively coupled to regions (e.g. source, drain, gate polysilicon) of other devices, thereby effectively providing such regions with discharge paths for injected charges.

With further reference to FIG. 4A, the person skilled in the art readily realizes that both the first and the second discharge paths (s-contacts) according to the present disclosure are purely resistive paths and therefore can allow symmetrical flow of charges from the two ends of the paths. This means that the present invention provides discharge paths for injected charges irrespective of a polarity of the potential gradient provided by sources (180, 190) of FIG. 1. Furthermore, decoupling of the discharge paths (and therefore between the source and the gate of the device) during normal operation of the device is provided by the high resistivity nature of the semiconductor substrate (401) which provides a high resistance path between the contact (315) and the contact (325). This means that contrary to the prior art embodiment depicted in FIGS. 3A-3C, the present invention allows, during normal operation of the device, for any biasing of the gate with respect to the source of the device, including a negative biasing ($V_G<V_S$) of the device according to the present invention. The person skilled in the art will appreciate such flexibility, as a negative biasing can provide, for example, a higher input/output isolation in some RF switching implementations.

According to further embodiment of the present disclosure, the second discharge path can be provided to the drain region of the transistor device instead of the source region, as depicted in FIG. 4B, with same level of decoupling (via high resistivity path) of the two paths as described above.

Figure 5A:
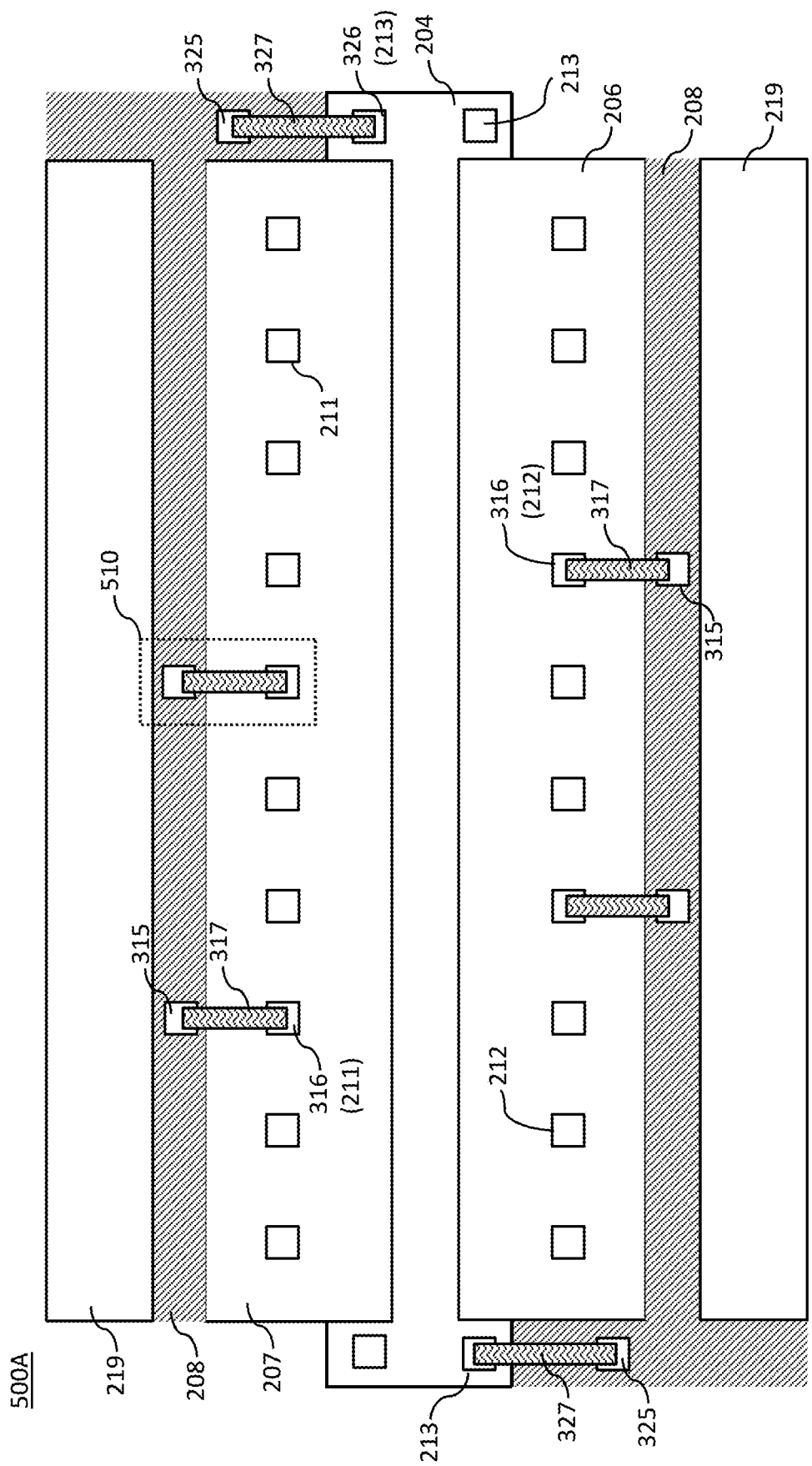
FIGS. 5A-5B show a top view of an SOI transistor device fitted with a plurality of s-contacts according to the present invention.
Figure 5B:
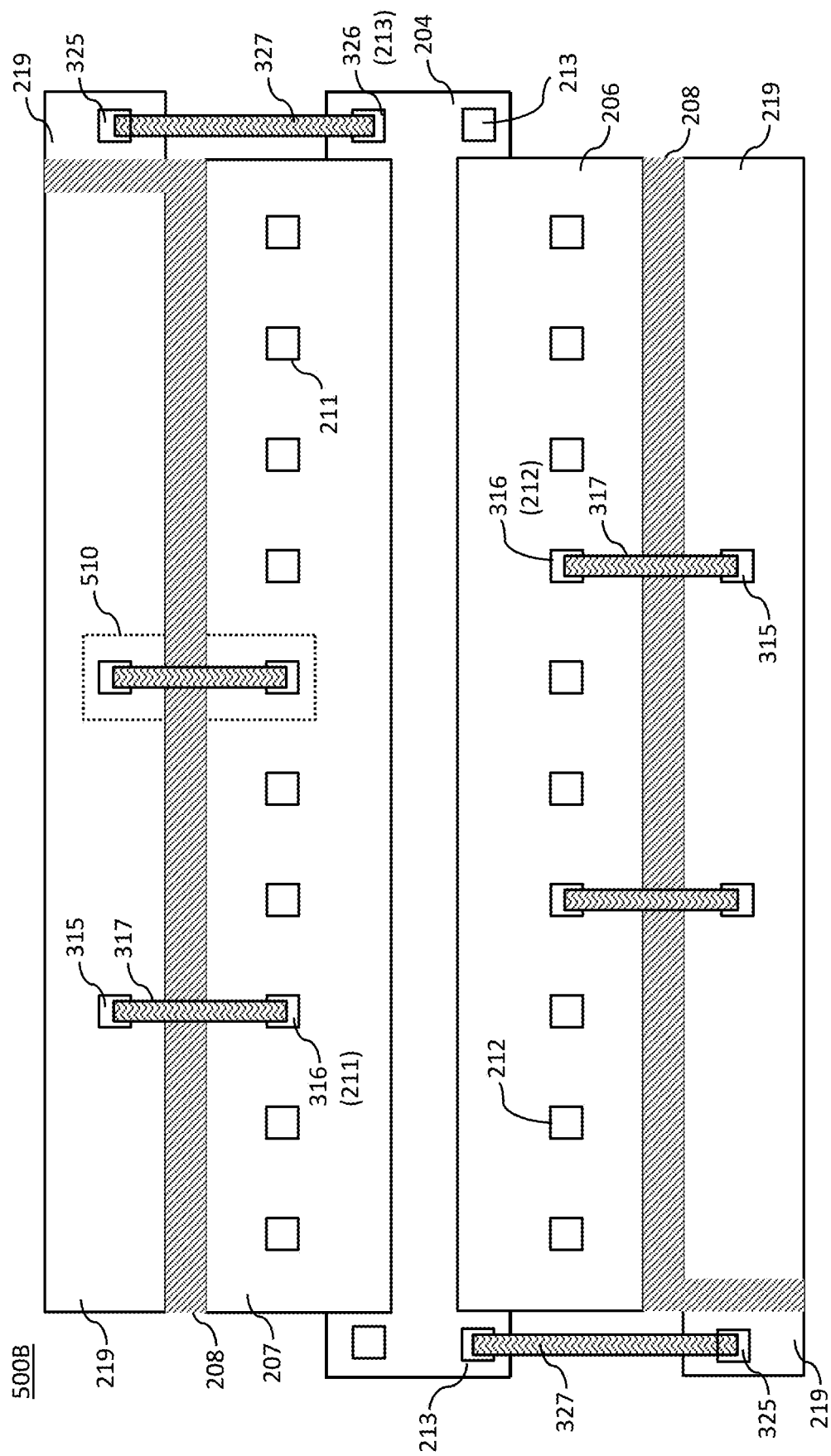

According to further embodiments of the present disclosure, separate and coexisting s-contacts (discharge paths) to each of the source region (207), drain region (206) and the gate polysilicon structure (204) can be provided. This embodiment represents a combination of the embodiment represented by FIGS. 4A and 4B. FIGS. 5A and 5B, later described, show such combination.

Figure 4C:
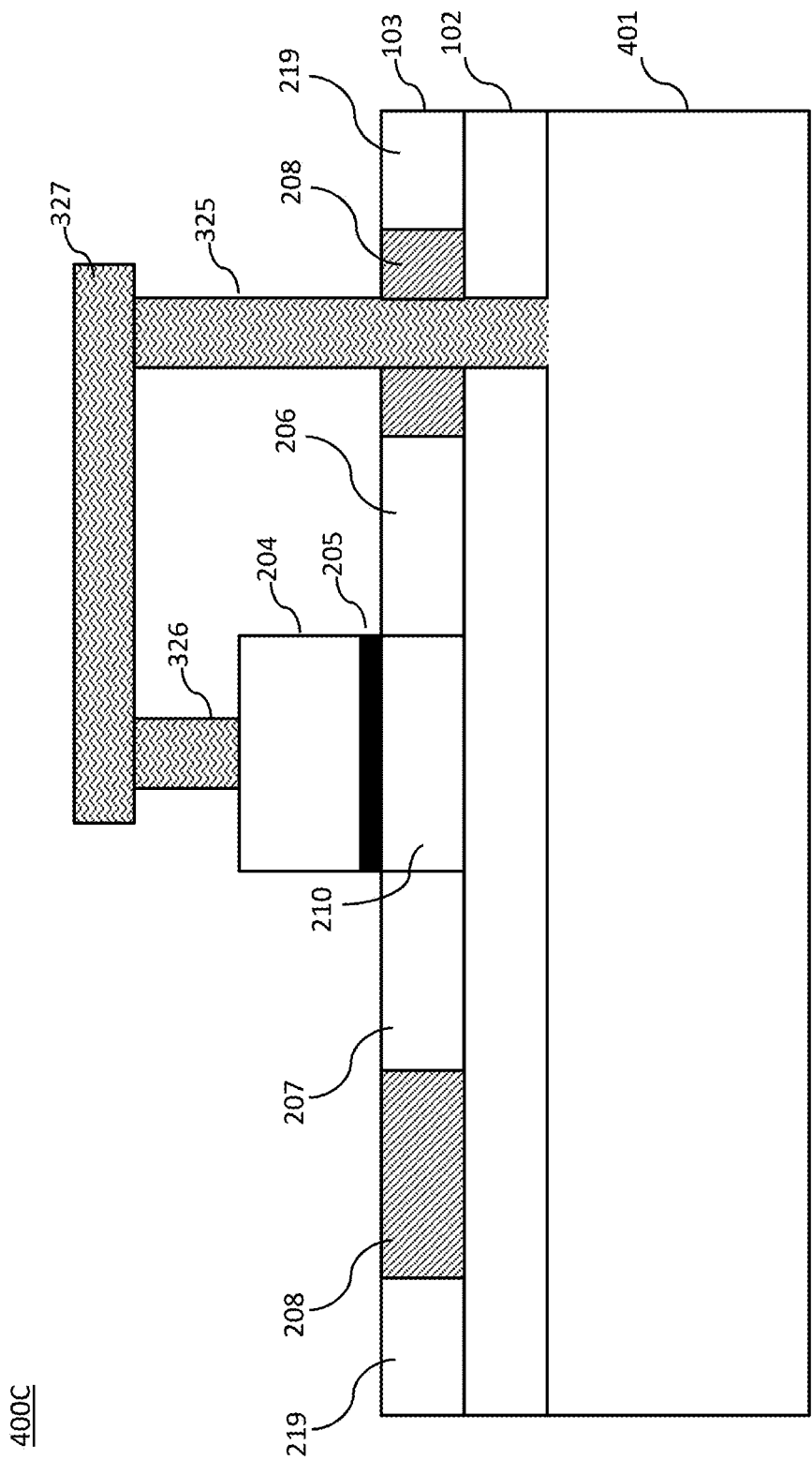
FIGS. 4C-4D show an SOI transistor device with one s-contact according to an embodiment of the present disclosure provided to one region of the transistor device. Other regions of the transistor device can be resistively coupled to s-contacts provided to other transistor devices.
Figure 4D:
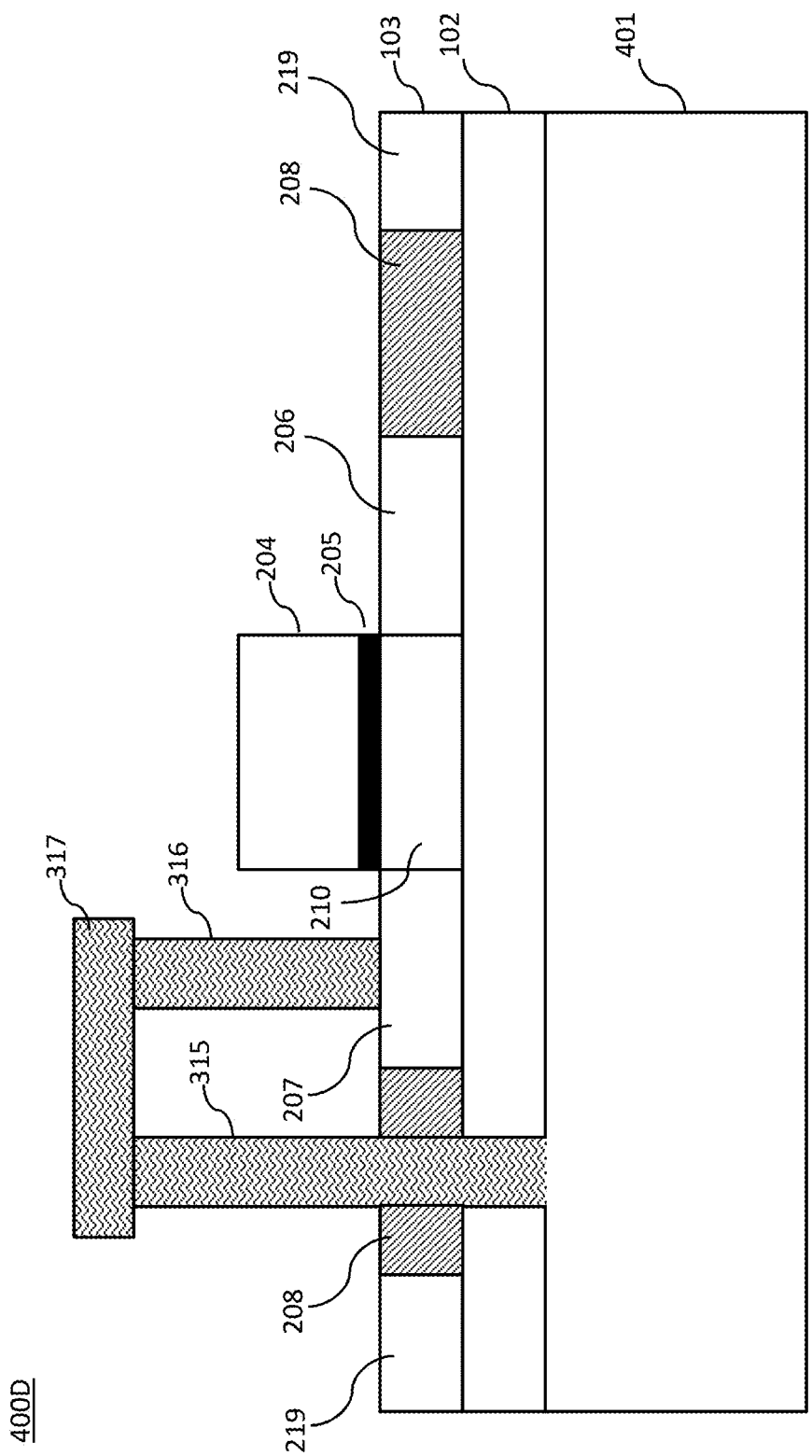

A semiconductor device according to the present invention can be provided with one, two, or more s-contacts, each with a direct connection to the drain/source region and/or gate polysilicon structure of the device. FIGS. 4A-4B show semiconductor devices according to the present disclosure having s-contacts each directly connected (direct connection) to the drain/source region and to the gate polysilicon structure of the device. FIGS. 4C-4D show a semiconductor device (400C, 400D) according to the present disclosure having an s-contact, (325, 326, 327), (315, 316, 317), directly connected to either the gate polysilicon structure (204) (FIG. 4C), or to the drain/source region (206/207) (FIG. 4D) of the device. As described above, although the semiconductor device (400C, 400D) does not include a direct connection to an s-contact for both an active region (e.g. 206, 207) of the device and the gate polysilicon structure of the device, a resistive coupling (connection) to an s-contact which has a direct connection to a different semiconductor device can be provided to the semiconductor device (400C, 400D).

Figure 4E:
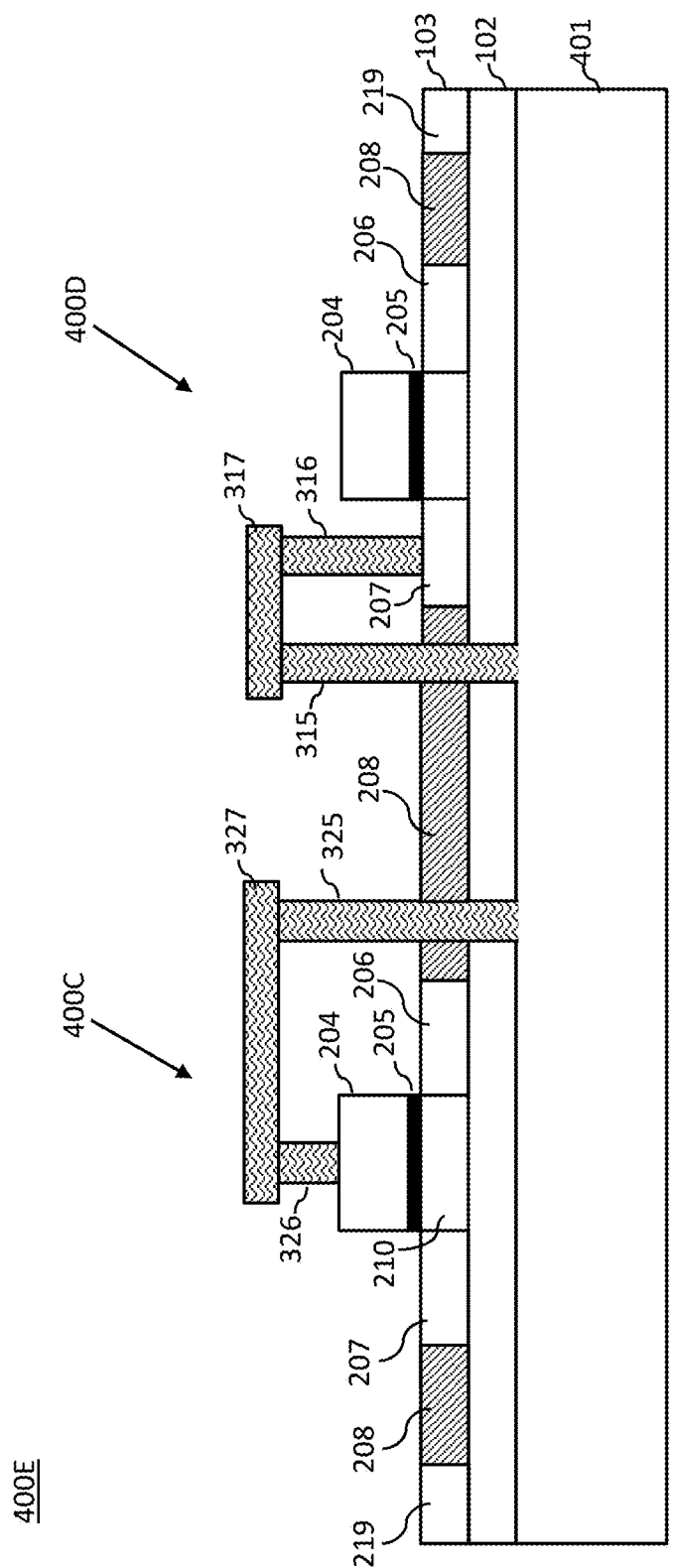
FIG. 4E shows two neighboring transistor devices, each with one s-contact according to an embodiment of the present disclosure.

FIG. 4E shows an exemplary configuration of the two semiconductor devices (400C, 400D) of FIGS. 4C and 4D fabricated on a same high resistivity semiconductor substrate (401). As can be seen in FIG. 4E, each of the s-contacts (325, 326, 327) and (315, 316, 317) penetrate through the layer (103) at an isolation region (208) of the layer, which isolates the active regions (e.g. 205, 206, 207) of the two semiconductor devices. In the exemplary embodiment according to the present disclosure depicted in FIG. 4E, the two s-contacts are shown to penetrate through a same (contiguous) isolation region (208). The person skilled in the art will know not to consider such exemplary embodiment as limiting what the inventors consider to be their invention, as, for example, the isolation region (208) need not be a contiguous region, and each of the s-contacts can penetrate through a different and non-contiguous isolation region.

Figure 4F:
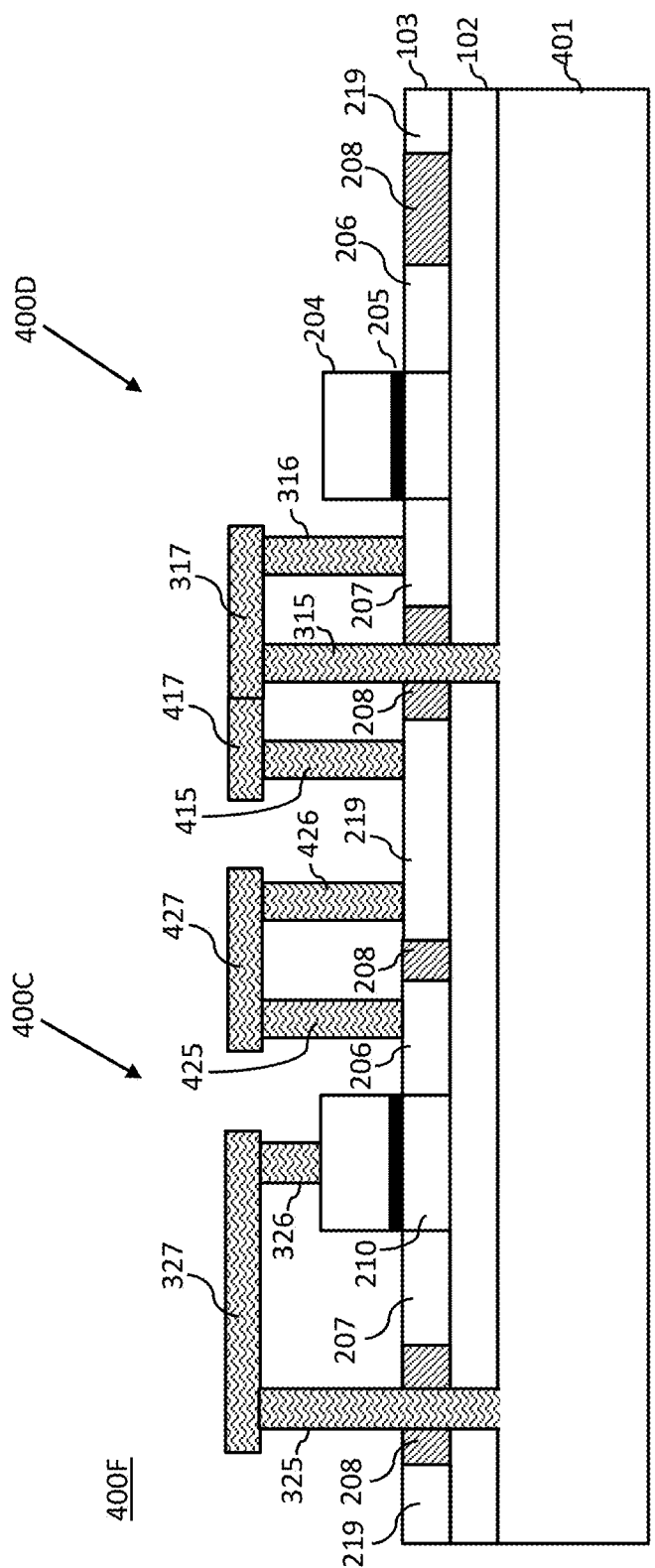
FIG. 4F shows a resistive coupling of an s-contact, associated with a first transistor device, to a second transistor device according to an embodiment of the present disclosure.

According to a further exemplary embodiment of the present disclosure, the s-contacts associated with two different semiconductor devices (400C, 400D) can penetrate the layer (103) at distinct (non-contiguous) isolation regions (208), as depicted in FIG. 4F. The exemplary embodiment according to the present disclosure depicted in FIG. 4F shows one exemplary configuration for resistively coupling (e.g. via elements 425, 426, 427, 219, 415, 417) an active region (206) of a first device (400C) to an s-contact (315, 316, 317) which is directly connected to an active region of a second device (400D), the first and the second devices having their respective active regions (206, 207, 210) separated by isolation regions (208).

As can be seen in the exemplary embodiment depicted in FIG. 4F, the drain region (206) of the device (400C) is connected, via conductive contact (425), conductive line (427) and conductive contact (426), to an active region (219) formed inside the layer (103). The active region (219) in turn provides a resistive conduction path between the conductive contact (426) and a conductive contact (415). Finally, the conductive contact (415) is resistively coupled to the conductive contact (315) of the s-contact (315, 316, 317) via conductive line (417), thereby providing the resistive coupling between the source region (206) of the first device (400C) and the s-contact (315, 316, 317) of the second device (400D).

With further reference to FIG. 4F, the active region (219), although not shown for clarity reasons, can include any active or passive component which can provide a resistive conduction path between the two contacts (426) and (415). This can include, for example, a combination of one or more resistors, one or more transistors, and related interconnections, that in combination, provide a resistive conduction path (therefore symmetrical with respect to a current flow) between the two conductive contacts (426) and (415), and thereby resistively couple an active region (206) of a first device (400C) to an s-contact which is directly connected to an active region (207) of a second device (400D). A person skilled in the art will understand that a similar configuration can be provided for resistively coupling a gate polysilicon region of a first device to an s-contact which is directly connected to a region (e.g. gate polysilicon structure) of a second device, the two devices being separated via one or more isolation regions (208).

Figure 4G:
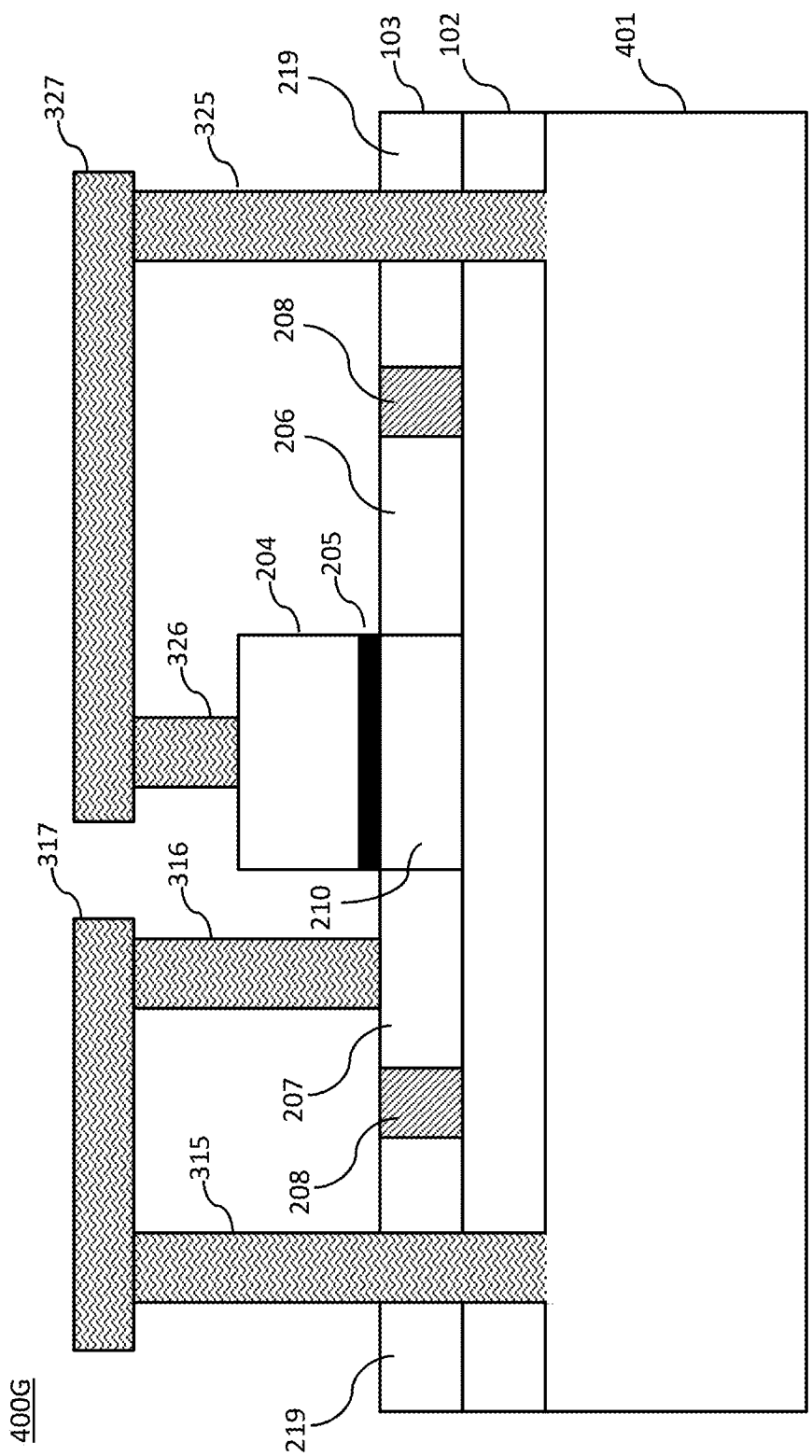
FIGS. 4G-4H show two s-contacts according to an embodiment of the present disclosure provided to an SOI transistor device, where the s-contacts penetrate through active regions of the transistor device.
Figure 4H:
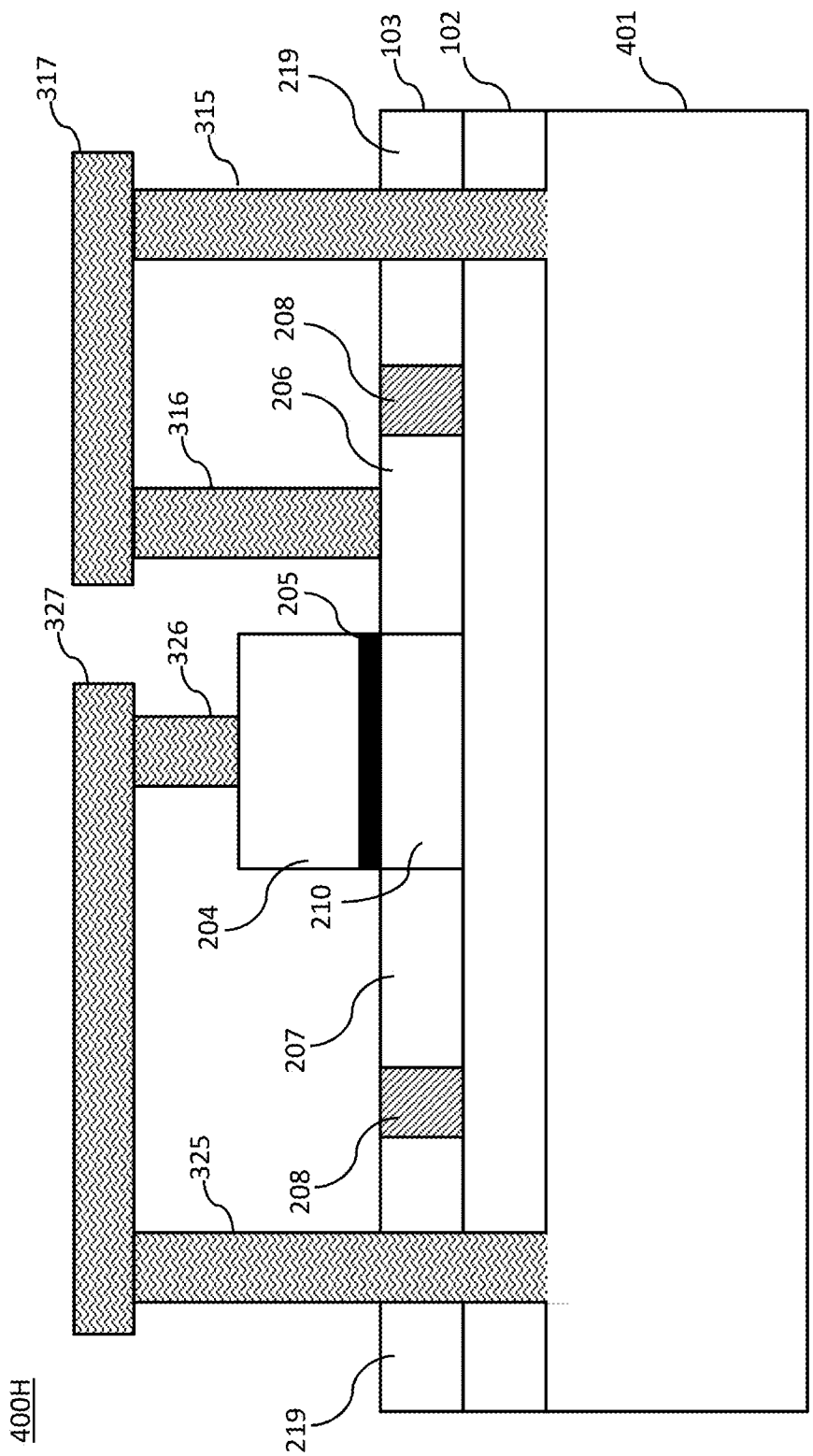

In the various exemplary embodiments according to the present disclosure presented above, the s-contact penetrates the layer (103) at an isolation region (208) formed in the layer (103). According to further exemplary embodiments of the present disclosure the s-contact can penetrate at active regions of the layer (103) (e.g. regions of the active layer (103) where current can flow), which can include drain and source regions of a transistor device, as well as passive components formed in the layer (103), such as resistors. FIGS. 4G and 4H show exemplary embodiments according to the present disclosure where the s-contact penetrate the layer (103) at active regions (219) of the layer different from the isolation regions (208). Similar embodiments based on each of FIGS. 4C-4F can be provided, where the s-contacts penetrate an active region (219) of the layer (103) instead of an isolation region (208) of the layer (103).

Figure 4I:
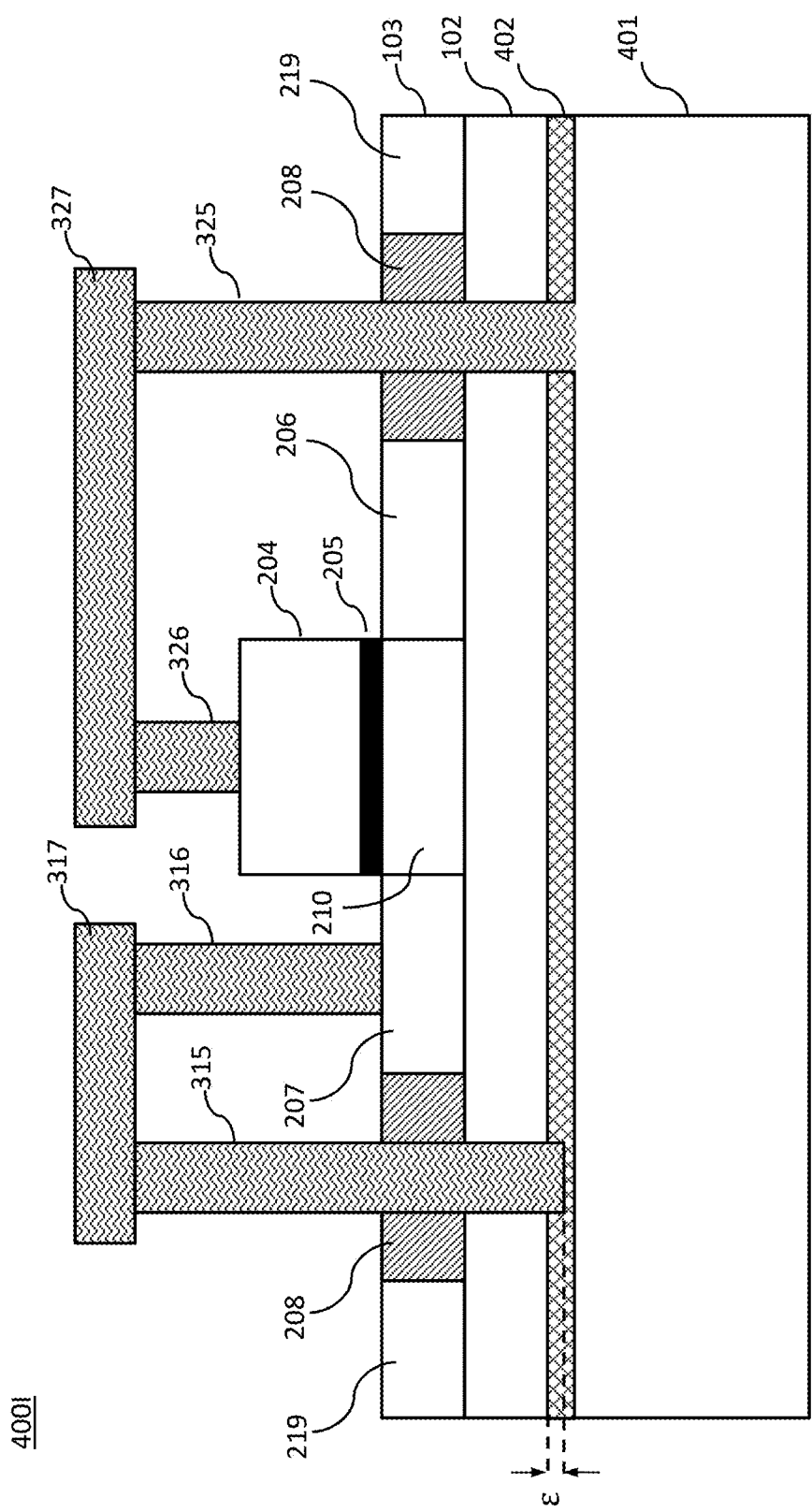
FIG. 4I shows two s-contacts according to an embodiment of the present disclosure provided to an SOI transistor comprising a trap rich layer.

FIG. 4I shows a semiconductor device (400I) according to an embodiment of the present disclosure which is fabricated on a high resistivity semiconductor substrate (401) with an overlying trap rich layer (402). As can be seen on FIG. 4I, the trap rich layer (402) is placed between the high resistivity substrate (401) and the BOX layer (102). In a case where a trap rich layer is provided, the s-contact (e.g. 325, 326, 327 of FIG. 4I) can further penetrate through the trap rich layer (402) to make (direct) contact with the high resistivity substrate (401). This is depicted in FIG. 4I, where it is shown that the conductive contact (325) of the s-contact (325, 326, 327) penetrates though the entire thickness of the trap rich layer (402) to reach, and make contact with, the high resistivity semiconductor substrate (401). Alternatively, since the trap rich layer can be conductive, the s-contact (e.g. 315, 316, 317 of FIG. 4H) can penetrate the trap rich layer (402) deep enough to make resistive contact, through a remaining thickness portion of the trap rich layer, with the highly resistive substrate (401). This can be seen in FIG. 4I, where the conductive contact (315) of the s-contact (315, 316, 317) penetrates the trap rich layer (402) at a depth ε, and does not make a direct contact with the high resistivity semiconductor substrate (401). The depth c at which the conductive contact (315) penetrates the trap rich layer (402) is enough to provide a resistive coupling (contact), of a desired resistance, through the remaining depth of the trap rich layer (402), to the high resistivity semiconductor substrate (401). In some embodiments, a depth ε substantially equal to zero can be sufficient to provide a desired resistive contact. The person skilled in the art will realize that any of the various embodiments of the s-contact described above and with reference to FIGS. 4A-4H can be also provided for the case where a trap rich layer is provided between the high resistivity substrate (401) and the BOX layer (102) as depicted in FIG. 4I. It should be noted that the resistivity of the trap rich layer (402) is generally of a same order of magnitude as the resistivity of the substrate (401).

Figure 4K:
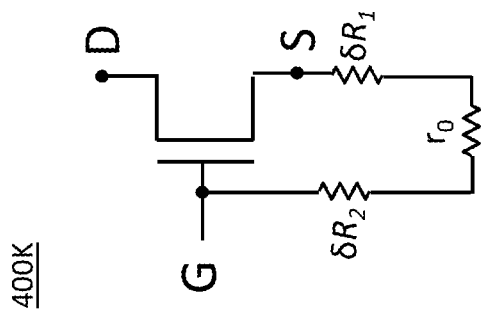
FIG. 4K shows a schematic representation of the device of FIG. 4A during normal operation of the device.
Figure 4J:
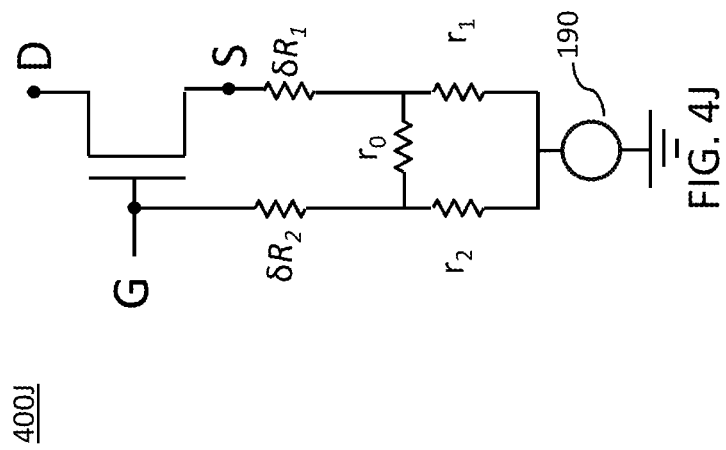
FIG. 4J shows a schematic representation of the device of FIG. 4A when the device is inside a process chamber.

FIGS. 4J and 4K schematically represent the device (400A) of the present invention in the configuration (400J), where the device is inside the process chamber (100), and in the configuration (400K), where the device is during normal operation. These figures show the transistor device (400A) and the corresponding conduction paths for each of the two configurations (400J) and (400K) provided by the associated s-contacts. Resistor $\delta R_2$ represents the combined (low) resistance of the s-contact (325, 326, 327), resistor $\delta R_1$ represents the combined (low) resistance of the s-contact (315, 316, 317), resistor $r_0$ represents a resistance of a high resistivity path between contacts (315) and (325), and resistors ($r_1$, $r_2$) represent resistances of resistive conduction paths between each of the contacts (315, 325) and the bottom electrode of the process chamber (which is provided a low reference potential, such as ground). The person skilled in the art will understand that resistances ($r_0$, $r_1$, $r_2$) are provided by the high resistivity semiconductor substrate (101).

FIGS. 4L and 4M schematically represent the device (400B) of the present invention in the configuration (400L), where the device is inside the process chamber (100), and in the configuration (400M), where the device is during normal operation. These figures show the transistor device (400B) and the corresponding conduction paths for each of the two configurations (400L) and (400M) provided by the associated s-contacts. Resistor $\delta R_2$ represents the combined (low) resistance of the s-contact (325, 326, 327), resistor $\delta R_1$ represents the combined (low) resistance of the s-contact (315, 316, 317), resistor $r_0$ represents a resistance of a high resistivity path between contacts (315) and (325), and resistors ($r_1$, $r_2$) represent resistances of resistive conduction paths between each of the contacts (315, 325) and the bottom electrode of the process chamber (which is provided a low reference potential, such as ground). The person skilled in the art will understand that resistances ($r_0$, $r_1$, $r_2$) are provided by the high resistivity semiconductor substrate (101).

According to a further embodiment of the present disclosure, the number of s-contacts provided to a transistor device (e.g. 400A, 400B) can be in accordance to a desired high limit potential across any two points of the transistor device during the charge injection process (e.g. plasma etching). Simulation software can provide such number and placement of the s-contacts in the device based on the high resistivity value of the semiconductor substrate (401) and induced currents through the s-contacts during the charge injection process. For example, a desired smaller voltage drop across the semiconductor substrate (401) during the charge injection process can be provided by an increased number of s-contacts which can thereby reduce the effective (equivalent) resistance values of $r_1$ and $r_2$ of FIGS. 4C-4F. Furthermore, the distance between contacts (315) and (325) can be optimized so as to obtain, during normal operation of the device, a desired resistive isolation between the first and the second s-contacts, and therefore effectively adjust the resistance value of resistor $r_0$ of FIGS. 4J-4M (e.g. effective/equivalent resistance value between gate and source and/or between gate and drain to be larger than a specified minimum value).

FIG. 5A shows a simplified top view of an SOI transistor device (e.g. 400A, 400B, 400I of FIGS. 4A, 4B, 4I) fitted with a plurality of s-contacts (510) according to the present invention. In the exemplary embodiment according to the present disclosure depicted in the FIG. 5A, two s-contacts (510) are provided to each of the source region (207), the drain region (206) and the gate polysilicon structure (204). As can be seen in FIG. 5A, the s-contacts (510) can share contacts (211, 212, 213) of the corresponding regions (source, drain, gate) and provide a resistive conduction path to the high resistivity semiconductor substrate (401) via conductive lines (317, 327) of the s-contacts going above and across the active regions (206, 207) of the device and reaching above the isolation regions (e.g. (208), where the conductive lines (317, 327) make contact with the conductive contacts (315, 325). In turn, the conductive contacts (315, 325) penetrate through the isolation regions (208) and the insulation layer (BOX) (102) to reach the high resistivity semiconductor substrate (401) and make direct contact with the high resistivity semiconductor substrate (401). In a case where a trap rich layer (e.g. 402 of FIG. 4I) exists between the high resistivity semiconductor substrate (401) and the BOX layer (102), the conductive contacts (315, 325) also penetrate the trap rich layer, either fully, to make direct contact with the substrate (401), or partially, to provide a resistive coupling to the substrate (401).

FIG. 5B shows a simplified top view of an SOI transistor device (e.g. 400G, 400H of FIGS. 4G-4H) fitted with a plurality of s-contacts (510) according to the present invention. In contrast to the exemplary embodiment according to the present disclosure depicted in FIG. 5A, the s-contacts of the SOI device depicted in FIG. 5B can penetrate a top layer of the device, which contains active regions (206, 207) of the device, via conductive contacts (315, 325), at an active region (219) which is isolated, via isolation regions (208), from the active regions (206, 207) of the device. The isolated region (219) can be an active region of a separate transistor, a resistor or any other device. Alternatively, one or more of the contacts (315, 325) do not penetrate the active region (219), but rather make resistive contact to the active region (219), the active region being in turn resistively coupled to the semiconductor (401) via an s-contact (not shown on FIG. 5B), as depicted in FIG. 4F.

Exemplary and non-limiting applications for transistor devices using the s-contact according to the various embodiments of the present disclosure can include general analog circuits, RF switches, power amplifiers (PAs), low noise amplifiers (LNAs), analog to digital converters (ADCs), voltage controlled oscillators (VCOs), and voltage reference circuits at frequencies ranging from DC to 100 GHz and beyond. In general, the s-contacts according to the teachings of the present disclosure can be used for any semiconductor device fabricated using CMOS technology on SOI substrate.

It should be noted that although the various exemplary embodiments according to the present disclosure were provided using an exemplary case of an N-type SOI MOSFET, such exemplary case was provided mainly for clarity purposes. The various embodiments of the s-contact according to the present invention can be equally adapted to other transistor types and other transistor technologies, especially where the source and/or the drain regions extend down to an insulation layer such as a "BOX" layer of an SOI device which can prevent a conduction path for high energy charges during, for example, a plasma etching process.

Applications that may include the novel apparatus and systems of various embodiments include electronic circuitry used in high-speed computers, communication and signal processing circuitry, modems, single or multi-processor modules, single or multiple embedded processors, data switches, and application-specific modules, including multilayer, multi-chip modules. Such apparatus and systems may further be included as sub-components within a variety of electronic systems, such as televisions, cellular telephones, personal computers (e.g., laptop computers, desktop computers, handheld computers, tablet computers, etc.), workstations, radios, video players, audio players (e.g., mp3 players), vehicles, medical devices (e.g., heart monitor, blood pressure monitor, etc.) and others. Some embodiments may include a number of methods.

It may be possible to execute the activities described herein in an order other than the order described. Various activities described with respect to the methods identified herein can be executed in repetitive, serial, or parallel fashion.

The accompanying drawings that form a part hereof show, by way of illustration and not of limitation, specific embodiments in which the subject matter may be practiced. The embodiments illustrated are described in sufficient detail to enable those skilled in the art to practice the teachings disclosed herein. Other embodiments may be utilized and derived there-from, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein individually or collectively by the term "invention" merely for convenience and without intending to voluntarily limit the scope of this application to any single invention or inventive concept, if more than one is in fact disclosed. Thus, although specific embodiments have been illustrated and described herein, any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the present disclosure is provided to comply with 37 C.F.R. § 1.72(b), requiring an abstract that will allow the reader to quickly ascertain the nature of the technical disclosure. It is submitted with the understanding that it will not be used to interpret or limit the scope or meaning of the claims. In the foregoing Detailed Description, various features are grouped together in a single embodiment for the purpose of streamlining the disclosure. This method of disclosure is not to be interpreted to require more features than are expressly recited in each claim. Rather, inventive subject matter may be found in less than all features of a single disclosed embodiment. Thus the following claims are hereby incorporated into the Detailed Description, with each claim standing on its own as a separate embodiment.

The invention claimed is:

1. A device comprising:
   a semiconductor substrate which consists of a single layer high resistivity semiconductor substrate, the high resistivity based on a nominal doping of the semiconductor substrate;
   a single layer trap rich layer overlying and in contact with the semiconductor substrate;
   an insulation layer overlying and in contact with the trap rich layer;
   an active layer overlying and in contact with the insulation layer, the active layer comprising active regions and isolation regions of the device;
   a transistor formed in the active layer, active regions of the transistor comprising a drain region, a source region and a gate channel region; and
   a first conductive structure resistively connecting one of: a) a drain contact or a source contact, or b) a gate contact, to the semiconductor substrate so that there can be a symmetrical flow of charges between the semiconductor substrate and the one of a) or b), the first conductive structure comprising:
      a first conductive line connecting the one of a) or b) to a first conductive contact, the first conductive contact extending through the active layer at an isolation region of the device, further extending through the insulation layer to make a contact with the semiconductor substrate that is arranged immediately below the single layer trap rich layer according to one of:
         i) a resistive contact by partially penetrating the trap rich layer, or
         ii) a direct contact by fully penetrating the trap rich layer.

2. The device according to claim 1, wherein an effective contact resistance between the first conductive contact and the high resistivity semiconductor substrate is in a range of 0.2 to 20 G-ohm.

3. The device according to claim 1, wherein the first conductive contact penetrates the trap rich layer partially, at a depth corresponding to a desired resistance value coupled between the resistive contact and the semiconductor substrate.

4. The device according to claim 1, wherein the resistive contact with the semiconductor region is through a thickness portion of the trap rich layer not penetrated by the first conductive contact.

5. The device according to claim 1, wherein a resistivity value of the high resistivity substrate is in a range of 3,000 to 20,000 ohm-cm.

6. The device according to claim 1, wherein a resistivity value of the high resistivity substrate is greater than 3,000 ohm-cm.

7. The device according to claim 1, further comprising a second conductive structure that resistively connects the other of the one of a) or b) to the semiconductor substrate so that there can be a symmetrical flow of charges between the semiconductor substrate and the other one of a) or b).

8. The device according to claim 7, wherein the second conductive structure comprises:
a second conductive line connecting the other of the one of a) or b) to a second conductive contact, the second conductive contact extending through the insulation layer and penetrating the trap rich layer to make resistive contact with the semiconductor substrate.

9. The device according to claim 7, further comprising one or more additional first conductive structures and/or one or more additional second conductive structures.

10. The device according to claim 9, wherein a number of the one or more additional first conductive structures is based on a desired equivalent resistance between the first conductive structures and the bottom surface of the semiconductor substrate away from the insulation layer.

11. The device according to claim 10, wherein a number of the one or more additional second conductive structures is based on a desired equivalent resistance between the second conductive structures and the bottom surface of the semiconductor substrate away from the insulation layer.

12. The device according to claim 1, wherein the transistor is one of: a) an N-type metal-oxide-semiconductor field effect transistor (NMOSFET), or b) a P-type metal-oxide-semiconductor field effect transistor (PMOSFET).

13. A method for providing a discharge path to a silicon-on-insulator (SOI) transistor device, the method comprising:
(i) forming an active layer on a semiconductor substrate consisting of a single layer high resistivity semiconductor substrate, the high resistivity based on a nominal doping of the semiconductor substrate, the active layer being isolated from the high resistivity substrate via an insulation layer overlying and contacting a single layer trap rich layer formed on and contacting the semiconductor substrate;
(ii) forming active regions of the transistor device in the active layer, the active regions comprising a source region, a drain region and a gate channel region;
(iii) forming a first conductive structure resistively connecting one of: a) a drain contact or a source contact, or b) a gate contact, of the transistor device to the semiconductor substrate thereby providing a symmetrical flow of charges between the semiconductor substrate and the one of a) or b), the first conducting structure being formed by:
forming a first conductive line connecting the one of a) or b) to a first conductive contact;
extending the first conductive contact through the active layer at an isolation region of the active layer and through the insulation layer to make a contact with the semiconductor substrate that is arranged immediately below the single layer trap rich layer according to one of:
iii-a) a resistive contact by partially penetrating the trap rich layer, or
iii-b) a direct contact by fully penetrating the trap rich layer, and
(iv) based on the forming of the first conductive structure, providing a first discharge path for symmetrical flow of charges to the transistor device.

14. The method according to claim 13, wherein the isolation region is a shallow trench isolation (STI) region.

15. The method according to claim 13, wherein an effective contact resistance between the first conductive contact and the semiconductor substrate is in a range of 0.2 to 20 G-ohm.

16. The method according to claim 13, wherein a resistivity value of the semiconductor substrate is in a range of 3,000 to 20,000 ohm-cm.

17. The method of claim 13, further comprising:
forming a second conductive structure; and
based on the forming, resistively connecting the other of the one of a) or b) to the semiconductor substrate.

18. The method of claim 17, wherein the forming of the second conductive structure comprises:
forming a second conductive line connecting the other of the one of a) or b) to a second conductive contact;
extending the second conductive contact through the active layer at an isolation region of the active layer and through the insulation layer to make a contact with the semiconductor substrate that is arranged immediately below the single layer trap rich layer according to one of:
a) a resistive contact by partially penetrating the trap rich layer, and
b) a direct contact by fully penetrating the trap rich layer, and
based on the forming of the second conductive structure, providing a second discharge path for symmetrical flow of charges to the transistor device.

19. A device comprising:
a semiconductor substrate which consists of a single layer high resistivity semiconductor substrate;
a single layer trap rich layer overlying and in contact with the semiconductor substrate;
an insulation layer overlying and in contact with the trap rich layer;
an active layer overlying and in contact with the insulation layer, the active layer comprising active regions and isolation regions of the device;
a transistor formed in the active layer, active regions of the transistor comprising a drain region, a source region and a gate channel region; and
a first conductive structure resistively connecting one of:
a) a drain contact or a source contact, or b) a gate contact, to the semiconductor substrate, the first conductive structure comprising:
a first conductive line connecting the one of a) or b) to a first conductive contact, the first conductive contact extending through the active layer at an isolation region of the device, further extending through the insulation layer to make a contact with the semiconductor substrate that is arranged immediately below the single layer trap rich layer according to one of:
i) a resistive contact by partially penetrating the trap rich layer, or
ii) a direct contact by fully penetrating the trap rich layer.

\* \* \* \* \*